(12) United States Patent
Tel et al.

(10) Patent No.: US 10,775,705 B2
(45) Date of Patent: Sep. 15, 2020

(54) PATTERNING STACK OPTIMIZATION

(71) Applicant: ASML NETHERLANDS B.V., Veldhoven (NL)

(72) Inventors: Wim Tjibbo Tel, Helmond (NL); Jozef Maria Finders, Veldhoven (NL); Orion Jonathan Pierre Mouraille, Eersel (NL); Anton Bernhard Van Oosten, Lommel (BE)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 16/325,228

(22) PCT Filed: Aug. 2, 2017

(86) PCT No.: PCT/EP2017/069513
§ 371 (c)(1),
(2) Date: Feb. 13, 2019

(87) PCT Pub. No.: WO2018/041507
PCT Pub. Date: Mar. 8, 2018

(65) Prior Publication Data
US 2019/0204749 A1 Jul. 4, 2019

(30) Foreign Application Priority Data
Aug. 30, 2016 (EP) ........................................ 6186305

(51) Int. Cl.
*G03F 7/20* (2006.01)

(52) U.S. Cl.
CPC .......... *G03F 7/705* (2013.01); *G03F 7/70625* (2013.01); *G03F 7/70633* (2013.01); *G03F 7/70866* (2013.01)

(58) Field of Classification Search
USPC ........................................................... 716/50
See application file for complete search history.

(56) References Cited

U.S. PATENT DOCUMENTS

| 7,587,704 B2 | 9/2009 | Ye et al. | |
| 2004/0267490 A1* | 12/2004 | Opsal | G03F 7/70625 702/127 |

(Continued)

OTHER PUBLICATIONS

International Search Report and Written Opinion issued in corresponding PCT Patent Application No. PCT/EP2017/069513, dated Oct. 19, 2017.

*Primary Examiner* — Bryce M Aisaka
(74) *Attorney, Agent, or Firm* — Pillsbury Winthrop Shaw Pittman LLP

(57) ABSTRACT

A method of tuning a patterning stack, the method including: defining a function that measures how a parameter representing a physical characteristic pertaining to a pattern transferred into a patterning stack on a substrate is affected by change in a patterning stack variable, the patterning stack variable representing a physical characteristic of a material layer of the patterning stack; varying, by a hardware computer system, the patterning stack variable and evaluating, by the hardware computer system, the function with respect to the varied patterning stack variable, until a termination condition is satisfied; and outputting a value of the patterning stack variable when the termination condition is satisfied.

21 Claims, 16 Drawing Sheets

(56) References Cited

U.S. PATENT DOCUMENTS

2008/0077362 A1 3/2008 Willis et al.
2009/0157360 A1 6/2009 Ye et al.
2012/0117522 A1 5/2012 Feng et al.

* cited by examiner

PATTERNING STACK OPTIMIZATION

CROSS-REFERENCE TO RELATED APPLICATIONS

This application is the U.S. national phase entry of PCT patent application no. PCT/EP2017/069513, which was filed on Aug. 2, 2017, which claims the benefit of priority of European patent application no. 16186305.5, which was filed on Aug. 30, 2016, and which is incorporated herein in its entirety by reference.

FIELD

The present disclosure relates to device manufacturing apparatuses and processes, and more particularly to a method or apparatus to optimize a patterning stack for use in a device manufacturing apparatus or process, for example, in a metrology apparatus or process, in a lithographic projection apparatus or process, and/or in an etching apparatus or process

BACKGROUND

A lithographic projection apparatus can be used, for example, in the manufacture of devices such as integrated circuits (ICs). In such a case, a patterning device (e.g., a mask) may contain or provide a device, e.g., circuit, pattern corresponding to an individual layer of the device ("design layout"), and this pattern can be transferred onto a target portion (e.g. comprising one or more dies) on a substrate (e.g., silicon wafer) that has been coated with a layer of radiation-sensitive material ("resist"), by methods such as irradiating the target portion via the pattern on the patterning device. In general, a single substrate contains a plurality of adjacent target portions to which the pattern is transferred successively by the lithographic projection apparatus, one target portion at a time. In one type of lithographic projection apparatuses, the pattern on the entire patterning device is transferred onto one target portion in one go; such an apparatus is commonly referred to as a stepper. In an alternative apparatus, commonly referred to as a step-and-scan apparatus, a projection beam scans over the patterning device in a given reference direction (the "scanning" direction) while synchronously moving the substrate parallel or anti-parallel to this reference direction. Different portions of the pattern on the patterning device are transferred to one target portion progressively. Since, in general, the lithographic projection apparatus will have a magnification factor M (generally <1), the speed F at which the substrate is moved will be a factor M times that at which the projection beam scans the patterning device.

Prior to transferring the pattern from the patterning device to the substrate, the substrate may undergo various procedures, such as priming, resist coating and a soft bake. After exposure, the substrate may be subjected to other procedures, such as a post-exposure bake (PEB), development, a hard bake and measurement/inspection of the transferred pattern. This array of procedures is used as a basis to make an individual layer of a device, e.g., an IC. The substrate may then undergo various processes such as etching, ion-implantation (doping), metallization, oxidation, chemo-mechanical polishing, etc., all intended to finish off the individual layer of the device. If several layers are required in the device, then the whole procedure, or a variant thereof, is repeated for each layer. Eventually, a device will be present in each target portion on the substrate. These devices are then separated from one another by a technique such as dicing or sawing, whence the individual devices can be mounted on a carrier, connected to pins, etc.

As noted, lithography is a significant step in the device manufacturing, where patterns formed on substrates define functional elements of the devices, such as microprocessors, memory chips etc. Similar lithographic techniques are also used in the formation of flat panel displays, micro-electro mechanical systems (MEMS) and other devices.

As device manufacturing processes continue to advance, the dimensions of functional elements have continually been reduced while the amount of functional elements, such as transistors, per device has been steadily increasing over decades. For example, layers of devices are manufactured using lithographic apparatuses that project a design layout onto a substrate using illumination from a deep-ultraviolet illumination source, creating individual functional elements having dimensions well below 100 nm, i.e. less than half the wavelength of the radiation from the illumination source (e.g., a 193 nm illumination source).

This process in which features with dimensions smaller than the classical resolution limit of a lithographic projection apparatus are printed, is commonly known as low-k1 lithography, according to the resolution formula $CD=k1\times\lambda/NA$, where $\lambda$ is the wavelength of radiation employed (e.g., 193 nm or EUV), NA is the numerical aperture of projection optics in the lithographic projection apparatus, CD is the "critical dimension"—generally the smallest feature size printed—and k1 is an empirical resolution factor. In general, the smaller k1 the more difficult it becomes to reproduce a pattern on the substrate that resembles the shape and dimensions planned by a device designer in order to achieve particular functionality and/or performance. To overcome these difficulties, sophisticated fine-tuning steps are applied to the lithographic projection apparatus and/or design layout. These include, for example, but not limited to, optimization of NA and optical coherence settings, customized illumination schemes, use of phase shifting patterning devices, optical proximity correction (OPC) in the design layout, or other methods generally defined as "resolution enhancement techniques" (RET).

SUMMARY

Thus, manufacturing devices, such as semiconductor devices, typically involves processing a substrate (e.g., a semiconductor wafer) using a number of fabrication processes to form various features and multiple layers of the devices. Such layers and features are typically manufactured and processed using, e.g., deposition, lithography, etch, chemical-mechanical polishing, and ion implantation. Multiple devices may be fabricated on a plurality of dies on a substrate and then separated into individual devices. This device manufacturing process may be considered a patterning process. A patterning process involves a patterning step, such as optical and/or nanoimprint lithography using a patterning device in a lithographic apparatus, to transfer a pattern on the patterning device to a substrate and typically, but optionally, involves one or more related pattern processing steps, such as resist development by a development apparatus, baking of the substrate using a bake tool, etching using the pattern using an etch apparatus, etc.

Further, as part of the patterning process, a plurality of layers may be stacked on top of a substrate. The plurality of layers may be collectively referred to as a patterning stack. Each layer of the patterning stack may be selected from, e.g., a hardmask layer, an anti-reflective coating (ARC) layer, a resist layer, a top coat layer and a functional device layer. In the patterning process, one or more metrology systems (e.g., a level sensor, and/or an alignment measurement system, and/or a CD, overlay, focus or dose measurement system) may be used to measure a parameter of the substrate, a lithographic apparatus may be used to produce a pattern on the resist layer, and an etching apparatus may be used to transfer the pattern on the resist layer to a layer (e.g., the hardmask layer).

One or more optical properties of the patterning stack can affect the measurement accuracy of the one or more metrology systems and the patterning performance of the patterning process (e.g., the lithographic apparatus and/or the etching apparatus). The one or more optical properties of the patterning stack are determined by, e.g., the material and thickness of the layers of the patterning stack.

Because of the complexity of a patterning stack, it may take a great amount of time and effort to define a patterning stack (e.g., selecting a material and determining a thickness for each layer of the patterning stack). As a result, it may take a year to define the patterning stack for manufacturing a device in a manufacturing process, e.g., in the 7 nm technology node. An existing process of defining a patterning stack may involve a great deal of experiments. Therefore, the existing process can be expensive and time consuming. Further, it can be difficult using the existing process to arrive at a suitable patterning stack due to the large amount of manufacturing specifications, requirements and possible variations. Therefore, it is desirable, for example, to provide method and apparatus to optimize the material and/or thickness of each layer of the patterning stack for optimal performance in the patterning process. Such an optimization process is referred to as patterning stack optimization. Thus, there is, for example, a need for an efficient and cost effective method and/or apparatus for patterning stack optimization.

Advantageously, the method and/or apparatus described herein for patterning stack optimization may significantly reduce the total time for achieving a satisfactory patterning stack. Additionally or alternatively, the method and/or apparatus described herein may reduce or eliminate a significant amount of experimental work, which thereby reduces the cost of manufacturing. Additionally or alternatively, the method and/or apparatus described herein may take into account the metrology process and/or the etching process along with the lithographic process at the same time, while the existing process may not consider the metrology process and/or etching process before a final stage of patterning process integration. Additionally or alternatively, the method and/or apparatus described herein may effectively optimize the material and/or thickness of each layer of the patterning stack for robust performance (e.g., have effective performance in response to process variations) in the patterning process (e.g., the metrology process, the lithographic process, and/or the etching process).

In an embodiment, there is provided a method of tuning a patterning stack, the method comprising: defining a function that measures how a parameter representing a physical characteristic pertaining to a pattern transferred into a patterning stack on a substrate is affected by change in a patterning stack variable, the patterning stack variable representing a physical characteristic of a material layer of the patterning stack; varying, by a hardware computer system, the patterning stack variable and evaluating, by the hardware computer system, the function with respect to the varied patterning stack variable, until a termination condition is satisfied; and outputting a value of the patterning stack variable when the termination condition is satisfied.

In an embodiment, there is provided a method comprising: optimizing, by a hardware computer system, a patterning stack variable, the patterning stack variable representing a physical characteristic of a material layer of a patterning stack on a substrate, with respect to a plurality of parameters each representing a physical characteristic pertaining to a pattern transferred into the patterning stack on the substrate, until a termination condition is satisfied; and outputting a value of the patterning stack variable when the termination condition is satisfied.

In an embodiment, there is provided a non-transitory computer program product comprising machine-readable instructions configured to cause a processor to cause performance of a method described herein.

BRIEF DESCRIPTION OF THE DRAWINGS

The accompanying drawings, which are incorporated herein and form a part of the specification, illustrate embodiments of an invention and, together with the description, further serve to explain the principles of embodiments of the invention and to enable a person skilled in the pertinent art to make and use the embodiments.

One or more embodiments will now be described with reference to the accompanying drawings. In the drawings, like reference numbers may indicate identical or functionally similar elements.

DETAILED DESCRIPTION

Before describing embodiments in detail, it is instructive to present an example environment in which embodiments may be implemented.

Figure 1:
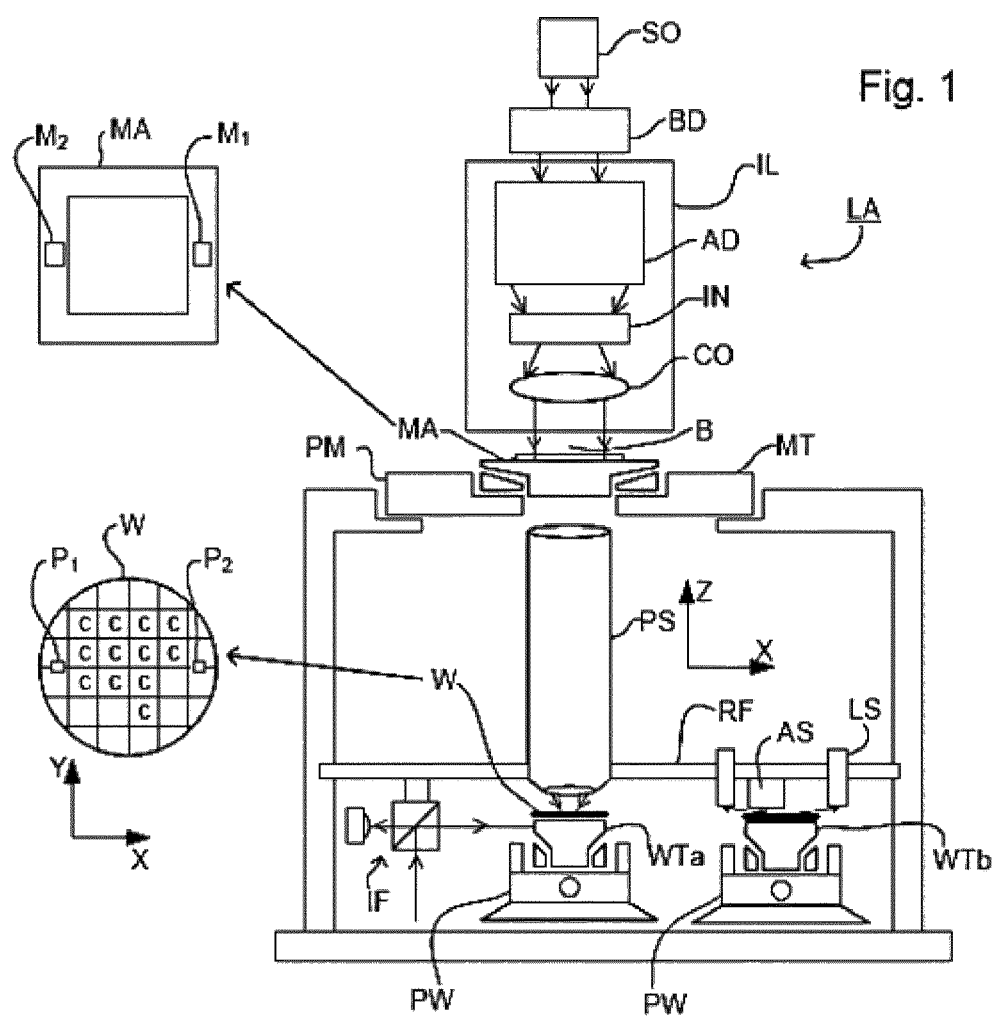
FIG. 1 schematically depicts an embodiment of a lithographic projection apparatus.

FIG. 1 schematically depicts a lithographic projection apparatus LA. The apparatus comprises:

an illumination system (illuminator) IL configured to condition a radiation beam B (e.g. DUV radiation or EUV radiation);

a support structure (e.g. a mask table) MT constructed to support a patterning device (e.g. a mask) MA and connected to a first positioner PM configured to accurately position the patterning device in accordance with certain parameters;

a substrate table (e.g. a wafer table) WTa constructed to hold a substrate (e.g. a resist-coated wafer) W and connected to a second positioner PW configured to accurately position the substrate in accordance with certain parameters; and a projection system (e.g. a refractive or reflective projection system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The term "projection optics" or "projection system" as used herein should be broadly interpreted as encompassing various types of optical systems, such as refractive optics, reflective optics, apertures, catadioptric optics, magnetic, electromagnetic and/or electrostatic optical systems, or any combination thereof, as appropriate for the exposure radiation being used, or for other factors such as the use of an immersion liquid or the use of a vacuum. The term "projection optics" or "projection system" may also include components operating according to any of these design types for directing, shaping or controlling the projection beam of radiation, collectively or singularly. The term "projection optics" or "projection system" may include any optical component in the lithographic projection apparatus, no matter where the optical component is located on an optical path of the lithographic projection apparatus. A projection optics or system may include optical components for shaping, adjusting and/or projecting radiation from the source before the radiation passes the patterning device, and/or optical components for shaping, adjusting and/or projecting the radiation after the radiation passes the patterning device. The projection optics or system generally excludes the illumination system and the patterning device. Any use of the term "projection lens" and "projection optics" herein may be considered as synonymous with the more general term "projection system".

The patterning device support structure holds the patterning device in a manner that depends on the orientation of the patterning device, the design of the lithographic projection apparatus, and other conditions, such as for example whether or not the patterning device is held in a vacuum environment. The patterning device support structure can use mechanical, vacuum, electrostatic or other clamping techniques to hold the patterning device. The patterning device support structure may be a frame or a table, for example, which may be fixed or movable as required. The patterning device support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable minor arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam, which is reflected by the minor matrix.

The patterning device referred to above comprises, or can form, one or more design layouts. The design layout can be generated utilizing CAD (computer-aided design) programs; this process often being referred to as EDA (electronic design automation). Most CAD programs follow a set of predetermined design rules in order to create functional design layouts/patterning devices. These rules are set by processing and design limitations. For example, design rules define the space tolerance between circuit devices (such as gates, capacitors, etc.) or interconnect lines, so as to ensure that the circuit devices or lines do not interact with one another in an undesirable way. One or more of the design rule limitations may be CD. CD of a circuit can be defined as the smallest width of a line or hole or the smallest space between two lines or two holes. Thus, the CD determines the overall size and density of the designed circuit. Of course, one of the goals in integrated circuit fabrication is to faithfully reproduce the original circuit design on the substrate (via the patterning device).

The term "mask" or "patterning device" as employed in this text may be broadly interpreted as referring to a generic patterning device that can be used to endow an incoming radiation beam with a patterned cross-section, corresponding to a pattern that is to be created in a target portion of the substrate; the term "light valve" can also be used in this context. Besides the classic mask (transmissive or reflective; binary, phase-shifting, hybrid, etc.), examples of other such patterning devices include:

a programmable mirror array. An example of such a device is a matrix-addressable surface having a viscoelastic control layer and a reflective surface. The basic principle behind such an apparatus is that (for example) addressed areas of the reflective surface reflect incident radiation as diffracted radiation, whereas unaddressed areas reflect incident radiation as undiffracted radiation. Using an appropriate filter, the said undiffracted radiation can be filtered out of the reflected beam, leaving only the diffracted radiation behind; in this manner, the beam becomes patterned according to the addressing pattern of the matrix-addressable surface. The required matrix addressing can be performed using suitable electronic means.

a programmable LCD array.

As here depicted, the apparatus is of a transmissive type (e.g., employing a transmissive mask). Alternatively, the apparatus may be of a reflective type (e.g., employing a programmable mirror array of a type as referred to above, or employing a reflective mask).

The lithographic projection apparatus may be of a type having two (dual stage) or more tables (e.g., two or more substrate tables, two or more patterning device support structures, a substrate table and metrology table, etc.). In such "multiple stage" machines a plurality of the multiple tables may be used in parallel, or preparatory steps may be carried out on one or more tables while one or more other tables are being used for pattern transfer.

The lithographic projection apparatus may also be of a type wherein at least a portion of the substrate may be covered by a liquid having a relatively high refractive index, e.g., water, so as to fill a space between the projection system and the substrate. An immersion liquid may also be applied to other spaces in the lithographic projection apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic projection apparatus may be separate entities, for example when the source is an excimer laser. In such cases, the source is not considered to form part of the lithographic projection apparatus and the radiation beam is passed from the source SO to the illuminator IL with the aid of a beam delivery system BD including, for example, suitable directing mirrors and/or a beam expander. In other cases the source may be an integral part of the lithographic projection apparatus, for example when the source is a mercury lamp. The source SO and the illuminator IL, together with the beam delivery system BD if required, may be referred to as a radiation system.

The illuminator IL may include an adjuster AD configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross section.

The radiation beam B is incident on the patterning device (e.g., mask) MA, which is held on the patterning device support (e.g., mask table MT), and is patterned by the patterning device. Having traversed the patterning device (e.g., mask) MA, the radiation beam B passes through the projection system PS, which focuses the beam onto a target portion C of the substrate W. With the aid of the second positioner PW and position sensor IF (e.g., an interferometric device, linear encoder, 2-D encoder or capacitive sensor), the substrate table WTa can be moved accurately, e.g., so as to position different target portions C in the path of the radiation beam B. Similarly, the first positioner PM and another position sensor (which is not explicitly depicted in FIG. 1) can be used to accurately position the patterning device (e.g., mask) MA with respect to the path of the radiation beam B, e.g., after mechanical retrieval from a mask library, or during a scan. In general, movement of the patterning device support (e.g., mask table) MT may be realized with the aid of a long-stroke module (coarse positioning) and a short-stroke module (fine positioning), which form part of the first positioner PM. Similarly, movement of the substrate table WTa may be realized using a long-stroke module and a short-stroke module, which form part of the second positioner PW. In the case of a stepper (as opposed to a scanner) the patterning device support (e.g., mask table) MT may be connected to a short-stroke actuator only, or may be fixed.

Patterning device (e.g., mask) MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device (e.g., mask) MA, the mask alignment marks may be located between the dies. Small alignment marks may also be included within dies, in amongst the device features, in which case it is desirable that the marks be as small as possible and not require any different imaging or process conditions than adjacent features. The alignment system, which detects the alignment marks is described further below.

The depicted apparatus could be used in at least one of the following modes:

At step mode, the patterning device support (e.g., mask table) MT and the substrate table WTa are kept essentially stationary, while an entire pattern imparted to the radiation beam is projected onto a target portion C at one time (i.e., a single static exposure). The substrate table WTa is then shifted in the X and/or Y direction so that a different target portion C can be exposed. At step mode, the maximum size of the exposure field limits the size of the target portion C imaged in a single static exposure.

In scan mode, the patterning device support (e.g., mask table) MT and the substrate table WTa are scanned synchronously while a pattern imparted to the radiation beam is projected onto a target portion C (i.e., a single dynamic exposure). The velocity and direction of the substrate table WTa relative to the patterning device support (e.g., mask table) MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

In another mode, the patterning device support (e.g., mask table) MT is kept essentially stationary holding a programmable patterning device, and the substrate table WTa is moved or scanned while a pattern imparted to the radiation beam is projected onto a target portion C. In this mode, generally a pulsed radiation source is employed and the programmable patterning device is updated as required after each movement of the substrate table WTa or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

The lithographic projection apparatus LA of FIG. 1 is a so-called dual stage type which has two tables WTa, WTb (e.g., two substrate tables) and two stations—a pattern transfer station and a measurement station—between which the tables can be exchanged. For example, while a substrate on one table is having a pattern transferred thereto at the pattern transfer station, another substrate can be loaded onto the other substrate table at the measurement station and various preparatory steps carried out. The preparatory steps may include determining the height and/or tilt of the surface of the substrate at a plurality of positions on the substrate (e.g., to generate a map) using a level sensor LS and measuring the position of alignment marks on the substrate using an alignment sensor AS, both sensors being supported by a reference frame RF. Based on the result, one or both of the tables WTa, WTb may be controlled accordingly, e.g. to ensure that the uppermost surface of the substrate W is located in the focus plane of the projection system PS and the appropriate portions of the substrate are patterned. As another example, while a substrate on one table has a pattern transferred thereto at the pattern transfer station, another table without a substrate waits at the measurement station (where optionally measurement activity may occur). This other table has one or more measurement devices and may optionally have other tools (e.g., cleaning apparatus). When the substrate has completed pattern transfer thereto, the table without a substrate moves to the pattern transfer station to perform, e.g., measurements and the table with the substrate moves to a location (e.g., the measurement station) where the substrate is unloaded and another substrate is load. These multi-table arrangements enable an increase in the throughput of the apparatus.

Whether the lithographic apparatus comprises multiple tables or a single table, a level sensor LS can be provided at or near the pattern transfer station to determine the height and/or tilt of the surface of the substrate to enable control of the surface of the substrate relative to the focus of the projection system PS. Similarly, an alignment sensor AS can be provided at or near the pattern transfer station to measure the position of alignment marks on the substrate so as to enable accurate pattern transfer.

Figure 2:
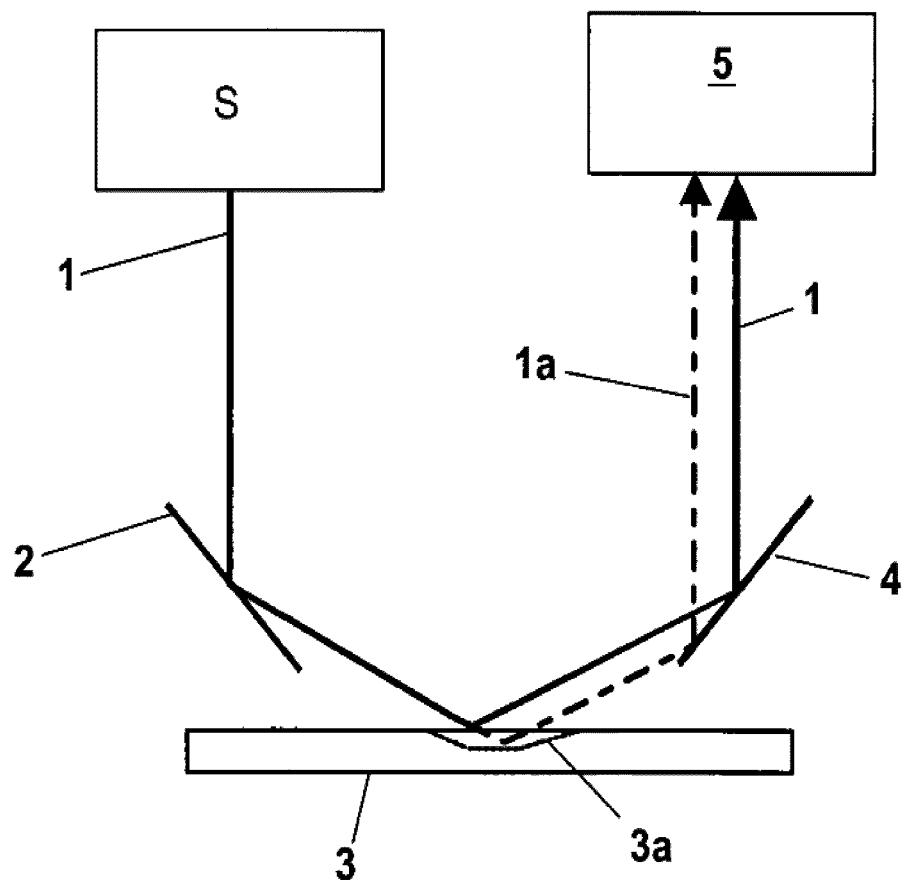
FIG. 2 depicts a schematic diagram of an example level sensor.

FIG. 2 illustrates a diagram of an example level sensor LS. As shown in FIG. 2, a beam of radiation 1 provided by an output S (e.g., generated by a suitable source S such as a laser) is directed via a folding mirror 2 to a substrate 3. The beam 1 is reflected from the surface of the substrate and is directed via a second folding mirror 4 to a detector 5. A change of height of the surface of the substrate 3 is seen as a displacement of the location at which the beam 1 is incident upon the detector 5. For example, if the surface of the substrate is flat, then the beam 1 is incident upon the center of the detector 5. If the surface of the substrate includes, e.g., an indentation, shown by dotted line 3a, then the point at which the beam 1 is reflected is displaced, as shown by broken line 1a. An associated translation of the beam 1 occurs at the detector 5, indicating that the height of the surface of the substrate has changed. The height of the surface of the substrate 3 is thus closely monitored by the level sensor. Similarly, tilt can be derived from measuring the height at a plurality of locations.

Figure 3:
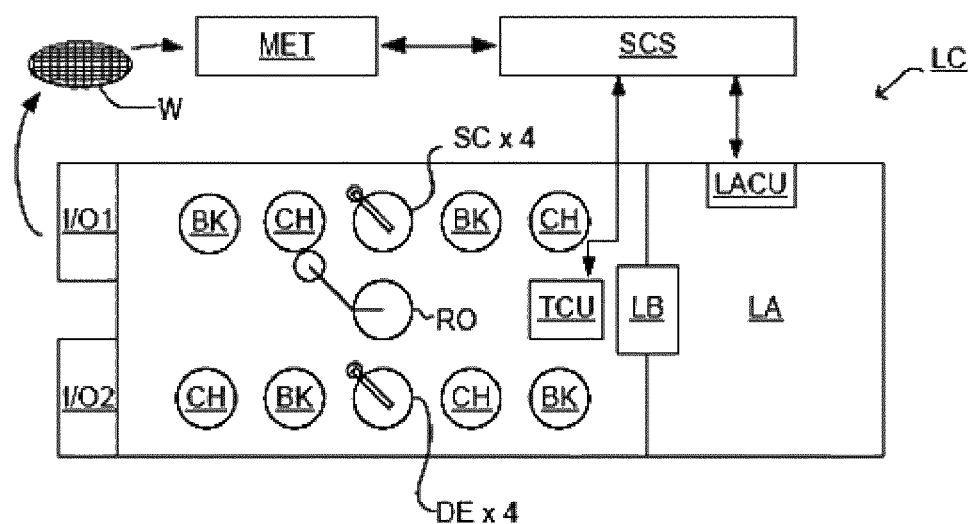
FIG. 3 schematically depicts an embodiment of a lithographic cell or cluster.

As shown in FIG. 3, the lithographic projection apparatus LA may form part of a lithographic cell LC, also sometimes referred to as a lithocell or lithocluster, which also includes apparatus to perform one or more pre- and post-pattern transfer processes on a substrate. Conventionally these include one or more spin coaters SC to deposit a resist layer, one or more developers DE to develop exposed resist, one or more chill plates CH and one or more bake plates BK. A substrate handler, or robot, RO picks up a substrate from input/output ports I/O1, I/O2, moves it between the different process devices and delivers it to the loading bay LB of the lithographic projection apparatus. These devices, which are often collectively referred to as the track, are under the control of a track control unit TCU which is itself controlled by the supervisory control system SCS, which also controls the lithographic projection apparatus via lithographic control unit LACU. Thus, the different apparatus may be operated to maximize throughput and processing efficiency.

It is desirable to inspect a patterned substrate to measure one or more properties such as overlay error between layers, line thickness, critical dimension (CD), focus, dose, etc. using, for example, a metrology apparatus MET (e.g., a CD-SEM tool, a diffraction-based optical measurement system, an image-based optical measurement system, etc.). If an error is detected, an adjustment may be made to, for example, patterning of one or more subsequent substrates using control system SCS. This may particularly useful, for example, if the inspection can be done soon and fast enough that another substrate of the same batch is still to be patterned. Also, an already patterned substrate may be stripped and reworked (to improve yield) or discarded, thereby avoiding performing patterning on a substrate that is known to be faulty. In a case where only some target portions of a substrate are faulty, further patterning may be performed only on those target portions which are good. Another possibility is to adapt a setting of a subsequent process step to compensate for the error, e.g. the time of a trim etch step can be adjusted to compensate for substrate-to-substrate CD variation resulting from a lithographic process step. As discussed further below, measurements may be used in the patterning process design (e.g., in designing the device design), control, and/or monitoring.

So, in an embodiment, an inspection apparatus MET is used to determine one or more properties of a substrate, and in particular, how one or more properties of different substrates or different layers of the same substrate vary from layer to layer and/or across a substrate. The inspection apparatus may be integrated into the lithographic projection apparatus LA or the lithocell LC or may be a stand-alone device. To enable most rapid measurements, it is desirable that the inspection apparatus measure one or more properties in the resist layer immediately after patterning. In an embodiment, the measurement may be taken of a latent image in exposed resist. But, the latent image in the resist has a very low contrast—there is only a very small difference in refractive index between the part of the resist which has been exposed to radiation and that which has not. So, measurements may be taken after the post-exposure bake step (PEB) which is customarily the first step carried out on an exposed substrate and increases the contrast between exposed and unexposed parts of the resist. At this stage, the image in the resist may be referred to as semi-latent. Further, in an embodiment and commonly, measurements may be made of the developed resist image—at which point either the exposed or unexposed parts of the resist have been removed—or after a pattern transfer step such as etching. Measuring after etching limits the possibility for rework of a faulty substrate but may still provide useful information, e.g. for the purpose of patterning process control.

In an optimization process of a system or process, a figure of merit of the system and/or process can be represented as a cost function. The optimization process boils down to a process of finding a set of parameters (design variables) of the system and/or process that optimizes (e.g., minimizes or maximizes) the cost function. The cost function can have any suitable form depending on the goal of the optimization. For example, the cost function can be weighted root mean square (RMS) of deviations of certain characteristics of the system and/or process with respect to the intended values (e.g., ideal values) of these characteristics; the cost function can also be the maximum of these deviations (i.e., worst deviation). The design variables of the system and/or process can be confined to finite ranges and/or be interdependent due to practicalities of implementations of the system and/or process. In the case of a patterning process, the constraints are often associated with physical properties and characteristics of the hardware and/or materials such as tunable ranges, and/or patterning device manufacturability design rules.

In a lithographic projection apparatus, a source provides illumination (i.e. radiation) to a patterning device and projection optics direct and shape the illumination, via the patterning device, onto a substrate. An aerial image (AI) is the radiation intensity distribution at substrate level. A resist layer on the substrate is exposed and the aerial image is transferred to the resist layer as a latent "resist image" (RI) therein. The resist image (RI) can be defined as a spatial distribution of solubility of the resist in the resist layer. A resist model can be used to calculate the resist image from the aerial image, an example of which can be found in U.S. Patent Application Publication No. U.S. 2009-0157360, the disclosure of which is hereby incorporated by reference in its entirety. The resist model is related only to properties of the resist layer (e.g., effects of chemical processes which occur during exposure, PEB and development). Optical properties of the lithographic projection apparatus (e.g., properties of the source, the patterning device and the projection optics) dictate the aerial image. Since the patterning device used in the lithographic projection apparatus can be changed, it may be desirable to separate the optical properties of the patterning device from the optical properties of the rest of the lithographic projection apparatus including at least the source and the projection optics.

Figure 4:
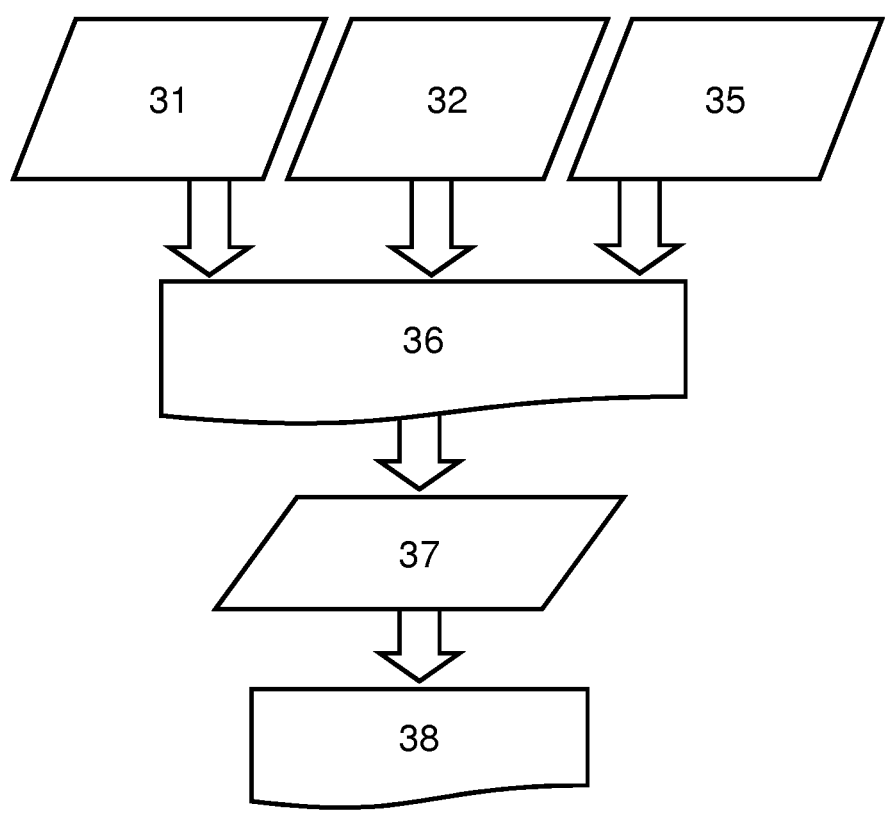
FIG. 4 is a block diagram of an embodiment of simulation models.

An exemplary flow chart for simulating lithography in a lithographic projection apparatus is illustrated in FIG. 4. As shown in FIG. 4, a source model 31 represents optical characteristics (including, e.g., radiation intensity distribution and/or phase distribution and/or polarization) of the source. A projection optics model 32 represents optical characteristics (including, e.g., changes to the radiation intensity distribution and/or the phase distribution caused by the projection optics, e.g., defined in terms of Zernike coefficients) of the projection optics. A design layout model 35 represents optical characteristics (including, e.g., changes to the radiation intensity distribution and/or the phase distribution caused by a given design layout 33) of a design layout, which is the representation of an arrangement of features on or formed by a patterning device. An aerial image 36 can be simulated from the design layout model 35, the projection optics model 32 and the design layout model 35. A resist image 38 can be simulated from the aerial image 36 using a resist model 37. Simulation of lithography can, for example, predict contours and CDs in the resist image.

More specifically, it is noted that the source model 31 can represent the optical characteristics of the illumination such as a numerical aperture setting, an illumination sigma ($\sigma$) setting and/or an illumination shape characteristic (e.g. off-axis radiation such as annular, quadrupole, dipole, etc. illumination). The projection optics model 32 can represent the optical characteristics of the projection optics, such as aberration, distortion, one or more refractive indexes, one or more physical sizes, one or more physical dimensions, etc. The design layout model 35 can represent one or more physical properties of a physical patterning device, as described, for example, in U.S. Pat. No. 7,587,704, which is incorporated by reference in its entirety. The objective of the simulation is to accurately predict, for example, edge placement, aerial image intensity slope and/or CD. The simulation results can be compared against associated values for an intended design layout and optionally used to generate an improved design layout. The intended design layout is generally defined as a pre-OPC design layout and the design layout can be provided in a standardized digital file format such as GDSII or OASIS or other file format.

It is appreciated that a similar flowchart may be applied to simulate etching in an etching apparatus or metrology in a metrology apparatus (e.g., a level sensor, alignment sensor, a CD, overlay, dose or focus measurement system, etc.). For example, for an optical metrology apparatus, a source model can represent optical characteristics (including, e.g., radiation intensity distribution and/or phase distribution and/or polarization) of the measurement radiation. A measurement hardware model can represent the optical projection and measurement characteristics of the metrology apparatus hardware. A measurement radiation distribution (e.g., an intensity distribution in, for example, a pupil) can be simulated from the source model and the measurement hardware model.

From the design layout, one or more portions may be identified, which are referred to as "clips". In an embodiment, a set of clips is extracted, which represents the complicated patterns in the design layout (typically about 50 to 1000 clips, although any number of clips may be used). These patterns or clips represent small portions (i.e. circuits, cells or patterns) of the design and more specifically, the clips typically represent small portions for which particular attention and/or verification is needed. In other words, clips may be the portions of the design layout, or may be similar or have a similar behavior of portions of the design layout, where one or more critical features are identified either by experience (including clips provided by a customer), by trial and error, or by running a full-chip simulation. Clips may contain one or more test patterns or gauge patterns. The clips may be process limiting and thus their study can help avoid studying the behavior of all of the design layout or more efficiently and quickly enable study (and then control, monitoring, design, etc.) of a patterning process.

An initial larger set of clips may be provided a priori by a customer based on one or more known critical feature areas in a design layout which require particular image optimization. Alternatively, in another embodiment, an initial larger set of clips may be extracted from the entire design layout by using some kind of automated (such as machine vision) or manual algorithm that identifies the one or more critical feature areas.

To enable simulation or other evaluation, a cost function may be expressed as:

$$CF(z_1, z_2, \ldots, z_N) = \sum_{p=1}^{P} w_p f_p(z_1, z_2, \ldots, z_N) \quad \text{(Eq. 1)}$$

wherein $(z_1, z_2, \ldots, z_N)$ are N design variables or values thereof. $f_p(z_1, z_2, \ldots, z_N)$ can be a function of the design variables $(z_1, z_2, \ldots, z_N)$ such as a difference between an actual value and an intended value of a characteristic for a set of values of the design variables of $(z_1, z_2, \ldots, z_N)$. $w_p$ is a weight constant associated with $f_p(z_1, z_2, \ldots, z_N)$. Of course, $CF(z_1, z_2, \ldots, z_N)$ is not limited to the form in Eq. 1. $CF(z_1, z_2, \ldots, z_N)$ can be in any other suitable form.

The functions, $f_p(z_1, z_2, \ldots, z_N)$ included in the cost function may represent any one or more suitable characteristics of the patterning process, e.g., of a lithographic projection apparatus, of a lithographic process, of a substrate, of an etch process, of a metrology apparatus, for instance, CD, focus, image shift, image distortion, image rotation, stochastic variation, throughput, local CD variation, process window, an interlayer characteristic, or a combination thereof. In one embodiment, the design variables ($z_1, z_2, \ldots, z_N$) comprise one or more parameters of the patterning process, e.g., of a lithographic projection apparatus, of a lithographic process, of a substrate, of an etch process, of a metrology apparatus, for instance focus, dose, global bias of the patterning device, polarization of illumination, and/or shape of illumination. The design variables can include any adjustable parameter such as an adjustable parameter of a patterning device, (projection or measurement) illumination, (projection or measurement) optics, dose, focus, etc. Since it is the resist image that often dictates the pattern on a substrate, the cost function may include a function that represents one or more characteristics of the resist image. For example, $f_p(z_1, z_2, \ldots, z_N)$ can be simply a distance between a point in the resist image to an intended position of that point (i.e., edge placement error $EPE_p(z_1, z_2, \ldots, z_N)$).

The lithographic projection apparatus may include components collectively called a "wavefront manipulator" that can be used to adjust the shape of a wavefront and intensity distribution and/or phase shift of a radiation beam. In an embodiment, the lithographic projection apparatus can adjust a wavefront and intensity distribution at any location along an optical path of the lithographic projection apparatus, such as before the patterning device, near a pupil plane, near an image plane, and/or near a focal plane. The wavefront manipulator can be used to correct or compensate for certain distortions of the wavefront and intensity distribution and/or phase shift caused by, for example, the illumination system, the patterning device, temperature variation in the lithographic projection apparatus, thermal expansion of components of the lithographic projection apparatus, etc. Adjusting the wavefront and intensity distribution and/or phase shift can change values of the characteristics represented by the cost function. Such changes can be simulated from a model or actually measured. The design variables can include parameters of the wavefront manipulator.

The design variables may have constraints, which can be expressed as $(z_1, z_2, \ldots, z_N) \in Z$, where Z is a set of possible values of the design variables. One possible constraint on the design variables may be imposed by a desired throughput of the lithographic projection apparatus. Without such a constraint imposed by the desired throughput, the optimization may yield a set of values of the design variables that are unrealistic. For example, if the dose is a design variable, without such a constraint, the optimization may yield a dose value that makes the throughput economically impossible. However, the usefulness of constraints should not be interpreted as a necessity.

The optimization process therefore is to find a set of values of the one or more design variables, under the constraints $(z_1, z_2, \ldots, z_N) \in Z$, that optimize the cost function, e.g., to find:

$$(\tilde{z}_1, \tilde{z}_2, \ldots, \tilde{z}_N) = \arg[\min_{(z_1, z_2, \ldots, z_N) \in Z} CF(z_1, z_2, \ldots, z_N) \pm \varepsilon] \quad \text{(Eq. 2)}$$

or $$(\tilde{z}_1, \tilde{z}_2, \ldots, \tilde{z}_N) = \arg[\max_{(z_1, z_2, \ldots, z_N) \in Z} CF(z_1, z_2, \ldots, z_N) \pm \varepsilon] \quad \text{(Eq. 2')}$$

where $\varepsilon$ is equal to zero or a small value deviated from zero. For example, $\varepsilon$ is equal to 0.1, 0.01, 0.2, 0.4, −0.01, −0.1, −0.4, etc.

Figure 5:
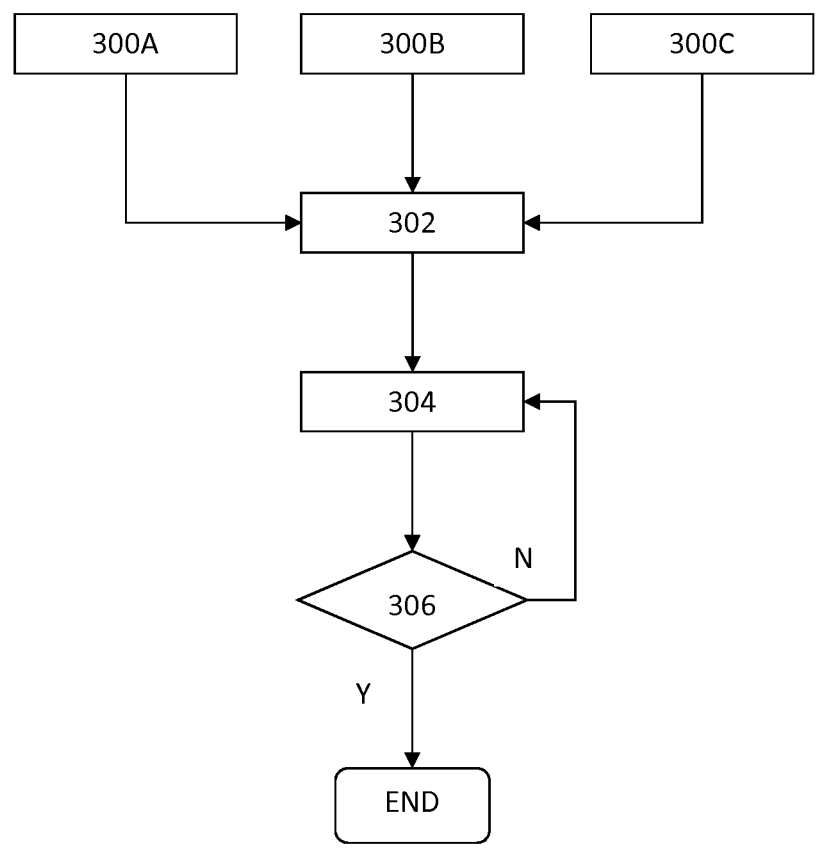
FIG. 5 is a flow diagram illustrating aspects of an example methodology of joint optimization/co-optimization.

A general method of optimizing, according to an embodiment, is illustrated in FIG. 5. By example, the optimization method is used to optimize a lithographic process. However, it should be understood that a similar method may be conducted to additionally or alternatively optimize an etching process and/or additionally or alternatively optimize a metrology process. As shown in FIG. 5, this method comprises a step 302 of defining a multi-variable cost function of a plurality of design variables. The design variables may comprise any suitable combination of design variables representing, e.g., one or more characteristics of the illumination (300A) (e.g., pupil fill ratio, namely percentage of radiation of the illumination that passes through a pupil or aperture), one or more characteristics of the projection optics (300B) and/or one or more characteristics of the design layout (300C). For example, the design variables may include design variables representing one or more characteristics of the illumination (300A) and of the design layout (300C) (e.g., global bias) but not of one or more characteristics of the projection optics (300B), which leads to an illumination-patterning device (e.g., mask) optimization ("source-mask optimization" or SMO). Or, the design variables may include design variables representing one or more characteristics of the illumination (300A) (optionally polarization), of the projection optics (300B) and of the design layout (300C), which leads to an illumination-patterning device (e.g., mask)-projection system (e.g., lens) optimization ("source-mask-lens optimization" or SMLO). At step 304, the design variables are simultaneously adjusted so that the cost function is moved towards convergence. At step 306, it is determined whether a predefined termination condition is satisfied. The predetermined termination condition may include various possibilities, e.g., one or more selected from: the cost function is minimized or maximized, as required by the numerical technique used, the value of the cost function is equal to a threshold value or crosses the threshold value, the value of the cost function reaches within a preset error limit, and/or a preset number of iterations is reached. If a condition at step 306 is satisfied, the method ends. If the one or more conditions at step 306 are not satisfied, the steps 304 and 306 are iteratively repeated until a desired result is obtained. The optimization does not necessarily lead to a single set of values for the one or more design variables because there may be a physical restraint, caused by a factor such as pupil fill factor, resist chemistry, throughput, etc. The optimization may provide multiple sets of values for the one or more design variables and associated performance characteristics (e.g., throughput) and allows a user of the lithographic projection apparatus to pick one or more sets.

The illumination, patterning device and projection optics can be optimized alternately (referred to as Alternate Optimization) or optimized simultaneously (referred to as Simultaneous Optimization). Patterns on multiple layers of the design layout may be optimized simultaneously or alternately. The terms "simultaneous", "simultaneously", "joint" and "jointly" as used herein mean that the one or more design variables representing one or more characteristics of the patterning process and/or any other design variable, are allowed to change at the same time. The term "alternate" and "alternately" as used herein means that not all of the design variables are allowed to change at the same time.

Figure 6:
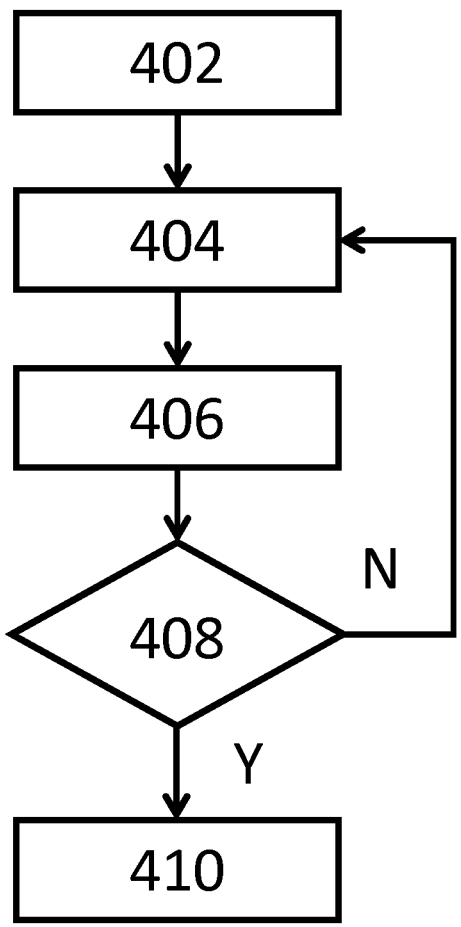
FIG. 6 depicts an embodiment of a further optimization method.

In FIG. 5, the optimization of all the design variables is executed simultaneously. Such a flow may be called simultaneous flow or co-optimization flow. Alternately, the optimization of all the design variables is executed alternately, as illustrated in FIG. 6. In this flow, in each step, some design variables are fixed while other design variables are varied to optimize the cost function; then in the next step, a different set of variables are fixed while the others are varied to optimize the cost function. These steps are executed alternately until convergence or a certain terminating condition is met. As shown in the non-limiting example flowchart of FIG. 6, first, a design layout (step 402) is obtained, then a step of illumination optimization is executed at step 404, where the one or more design variables of the illumination are optimized (SO) to minimize or maximize the cost function while other design variables are fixed. Then in the next step 406, a patterning device (e.g., mask) optimization (MO) is performed, where the design variables of the patterning device are optimized to minimize or maximize the cost function while other design variables are fixed. These two steps are executed alternately, until a certain terminating condition is met at step 408. One or more various termination conditions can be used, such as the value of the cost function becomes equal to a threshold value, the value of the cost function crosses the threshold value, the value of the cost function reaches within a preset error limit, a preset number of iterations is reached, etc. Note that SO-MO-Alternative-Optimization is used as an example for the alternative flow. The alternative flow can take many different forms, such as SO-LO-MO-Alternative-Optimization, where SO, LO (projection optics optimization) is executed, and MO alternately and iteratively; or first SMO can be executed once, then execute LO and MO alternately and iteratively; and so on. Another alternative is SO-PO-MO (illumination optimization, polarization optimization and patterning device optimization). In view of the present disclosure, numerous permutations and combinations of sub-optimizations are possible in order to achieve the desired optimization results. Finally the output of the optimization result is obtained at step 410, and the process stops.

And, while the discussion above focused on a lithographic process, similar techniques can be applied to an etch process, to a metrology process, etc., of the patterning process. Moreover, the optimization of an etch process or a metrology process can be combined with other processes of the patterning process. For example, a lithographic process can be optimized with a metrology process and/or an etch process (whether by simultaneous optimization, alternative optimization, etc.). As another example, a metrology process can be optimized with an etch process (whether by simultaneous optimization, alternative optimization, etc.).

Figure 7:
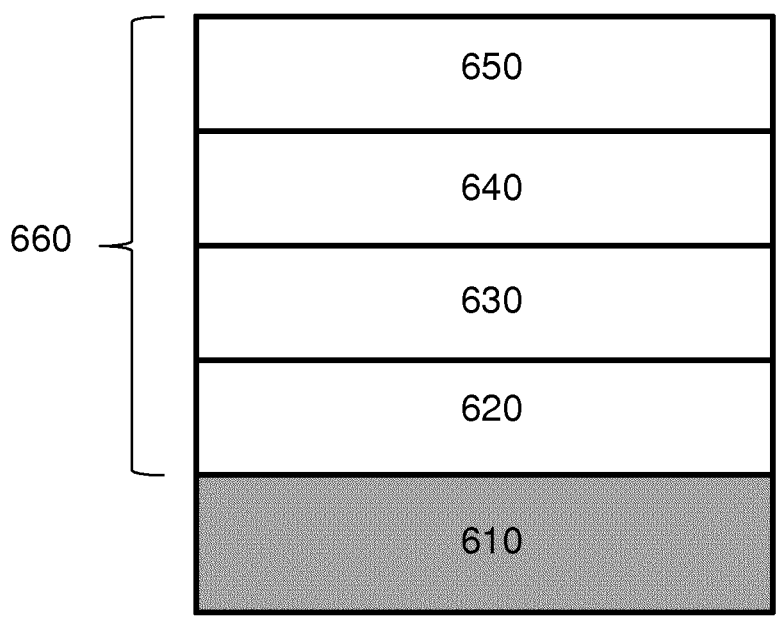
FIG. 7 depicts an example of a patterning stack.

As noted above, manufacturing a product may involve processing a patterning stack on a substrate. FIG. 7 depicts an example patterning stack 660 on top of a substrate 610. As shown, the patterning stack 660 includes a hardmask layer 620, a bottom anti-reflective coating (BARC) layer 630, a resist (e.g. photoresist) layer 640, and a top coat layer 650. In an embodiment, the patterning stack 660 may include a portion of the layers as shown in FIG. 7. For example, the patterning stack 660 may not include the top coat layer 650. In an embodiment, the patterning stack 660 may include one or more additional layers, for example, a sacrificial light absorbing material (SLAM) layer, e.g., between the BARC layer 630 and the hardmask layer 620. The SLAM layer (not shown) may comprise a polymer material having a radiation absorbing property configured to reduce standing waves in the patterning stack 660.

The hardmask layer 620, also called a memory or memorization layer, may be located directly on the substrate 610. The hardmask layer 620 is provided to be patterned in an etching process that transfers a pattern from the resist layer 640 to the hardmask layer 620. The hardmask layer 620 may comprise silicon nitride, silicon dioxide, or one or more other suitable materials. In an embodiment, the hardmask layer 620 may be a spin-on carbon (SoC) hardmask layer. The BARC layer 630 may be located above the hardmask layer 620 and comprise an anti-reflective material configured to reduce standing waves in the patterning stack 660.

The resist layer 640 may be located above the BARC layer 630. The resist layer 640 is provided to be patterned in a lithographic process that transfers a pattern from a patterning device to the resist layer 640. The top coat layer 650 may be coated on the resist layer 640. For example, in immersion lithography, the resist layer 640 and the top coat layer 650 are both covered in a liquid, e.g., water, during exposure of the photoresist. The top coat layer 650 is configured to prevent chemical diffusion between the liquid and the resist, thus, e.g., reducing a defect in the resist layer 640.

In operation of a patterning process, the patterning stack 660 is provided on the substrate 610 as shown in FIG. 7. One or more metrology sensors (e.g., a level sensor and/or an alignment sensor and/or a CD, overlay, focus or dose measurement system) may be used to determine a parameter (e.g., position, overlay, CD, etc.) of the substrate 610, a lithographic projection apparatus may be used to produce a pattern on the resist layer 640 by exposing the resist layer 640, and an etching apparatus may be used to transfer a developed pattern on the resist layer 640 to the hardmask layer 620. In some examples, the hardmask layer 620 may be patterned multiple times by repeated lithographic processing and etching, e.g., in multiple (double, triple, etc.) patterning.

As described above, the optical property of the patterning stack affects the measurement accuracy of a metrology sensor (e.g., the alignment sensor AS, and/or the level sensor LS and/or the metrology apparatus MET) and the patterning performance of the lithographic apparatus and the etching apparatus. Further, the optical property of the patterning stack is determined by one or more materials properties and the thickness of each layer of the patterning stack. Specifically, the materials property of each layer of the patterning stack may be characterized by, e.g., the material type, the refractive index, n, of the material and/or the extinction coefficient, k of the material. Therefore, changing the material type, refractive index n, the extinction coefficient k, and/or the thickness of one or more layers of the patterning stack may result in varied performance of a metrology sensor, a lithographic apparatus, and/or an etching apparatus.

Further, the materials property of each layer of the patterning stack may be selected based on an electrical requirement of the material, an etching requirement of the material (e.g., etch selectivity, etch rate, etc.), and/or any other suitable requirement. Changing the materials property may involve replacing the material completely with a material of a different type or adjusting the composition of the material, for example, by adding an appropriate amount of acid or base in the material of the layer.

As such, optimizing the patterning stack may be equivalent to optimizing one or more design variables, such as the refractive index n, the extinction coefficient k, and the thickness of one or more of the layers of the patterning stack, for optimal performance of one or more metrology sensors, the lithographic apparatus, and the etching apparatus, subject to one or more requirements of the device being manufactured (e.g., electrical requirements) and/or the patterning process (e.g., limitations on thickness, materials used, etc.).

Besides merely selecting a patterning stack for functional purposes in the device produced using the patterning stack, an existing process for patterning stack design selects the thickness of one or more layers of the patterning stack 660 to minimize the reflectivity of projection radiation during a lithographic process. This is done because an undesirable standing wave may be formed when incoming radiation in the resist layer 640 and reflected radiation from the BARC layer 630 interfere in the resist layer 640; the standing wave may cause an undesirable ridge in a sidewall of a pattern in the resist layer 640. So, for example, the thickness of the BARC layer 630 is chosen to minimize the reflectivity of radiation back through the resist; minimizing the reflectivity by selection of the thickness of the BARC layer 630 may reduce the formation of a standing wave in the resist layer 640. In some examples, the thickness of the BARC layer 630 may be selected based on a swing curve, showing a sinusoidal variation in reflectivity with changing thickness of the BARC layer 630.

However, without taking into account a pattern profile in the lithographic process, a metrology process and/or an etching process, the existing process may not result in formation of a desirable pattern on the hardmask layer 620 after the etching process. In an embodiment, the pattern profile may be referred to an aerial image, a resist image, or an etch image, all of which may be obtained by measurement or simulation using an appropriate mathematical model.

As such, it is desirable to provide a method and/or apparatus for patterning stack optimization that takes into account the patterning profile in the lithographic process, a metrology process and/or an etching process. The method for pattern stack optimization may be applied to optimize for one or more characteristics in the metrology process, the lithographic process, and the etching process, other than the reflectivity of the BARC layer.

Figure 8:
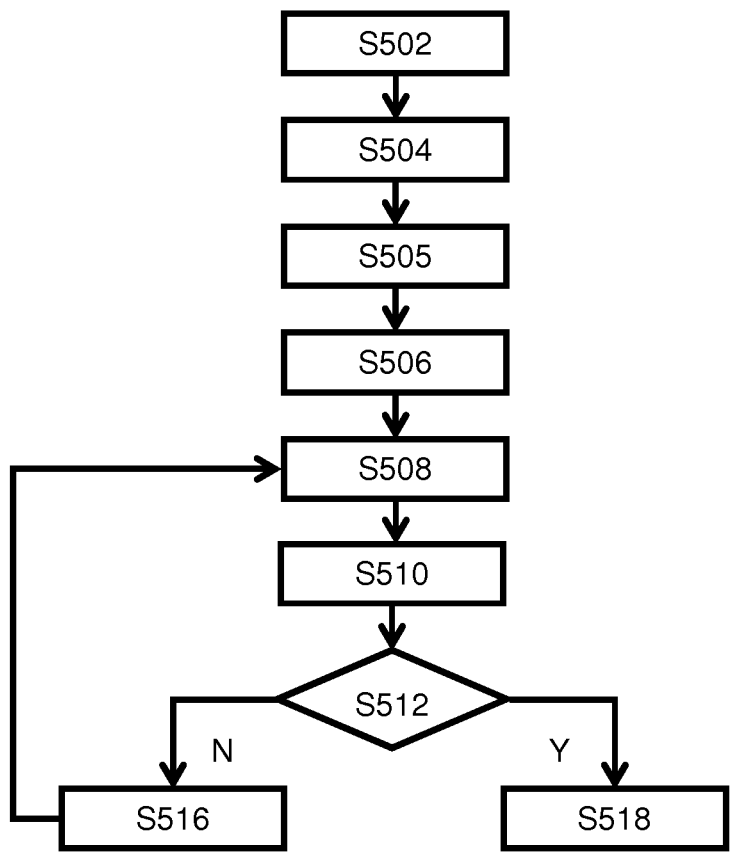
FIG. 8 depicts an example flowchart of a patterning stack optimization process, according to an embodiment.

FIG. 8 shows an exemplary method for patterning stack optimization. At step S502, an initial value of each of one or more design variables is obtained, including one or more associated tuning ranges, if any. In an embodiment, the one or more design variables, i.e., $z_1, z_2, \ldots z_N$ (N≥1), is one or more selected from: a material type, a refractive index n, an extinction coefficient k, and/or a thickness, of one or more layers of the patterning stack.

At step S504, a value for each of one or more parameters are obtained corresponding to the one or more design variables. Each of the one or more parameters represents a characteristic of the patterning process (e.g., the metrology process, the lithographic process, and the etching process) that is to be optimized. For example, in an embodiment, at least one parameter of the one or more parameters represents one or more characteristics of the metrology process. In an embodiment, the at least one parameter includes one or more selected from an alignment parameter that characterizes the alignment accuracy of an alignment sensor (e.g., the sensor AS of the lithographic projection apparatus in FIG. 1), a leveling parameter that characterizes the leveling accuracy of a level sensor (e.g., the sensor LS of the lithographic projection apparatus in FIG. 1), and/or a metrology parameter that characterizes the measurement accuracy of a metrology apparatus (e.g., metrology apparatus MET of FIG. 3). Values of the at least one parameter may be determined based on a simulation of the metrology sensor (e.g., the alignment sensor AS, or the level sensor LS, or the metrology apparatus MET) using a sensor model. Values of the at least one parameter may be simulated or measured based on the one or more design variables.

Figure 9A:
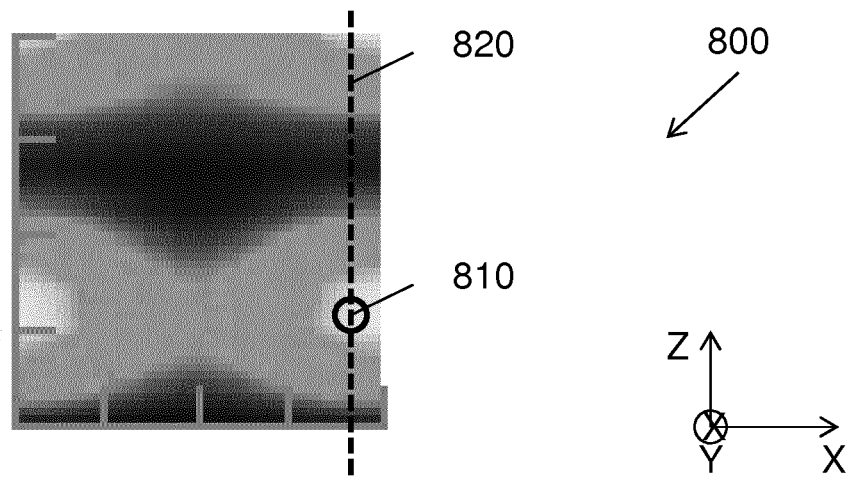
FIG. 9A depicts an example method of determining a standing wave parameter based on a resist image.
Figure 9B:
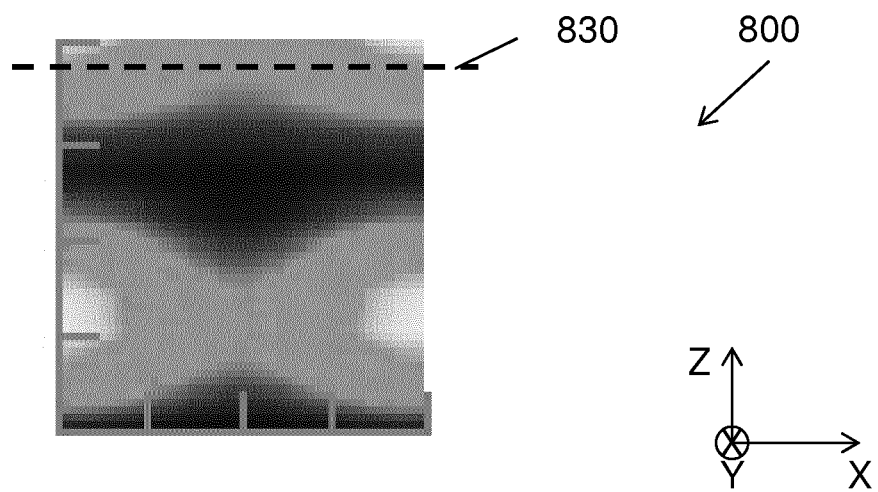
FIG. 9B depicts an example method of determining a contrast variation parameter based on a resist image.
Figure 9C:
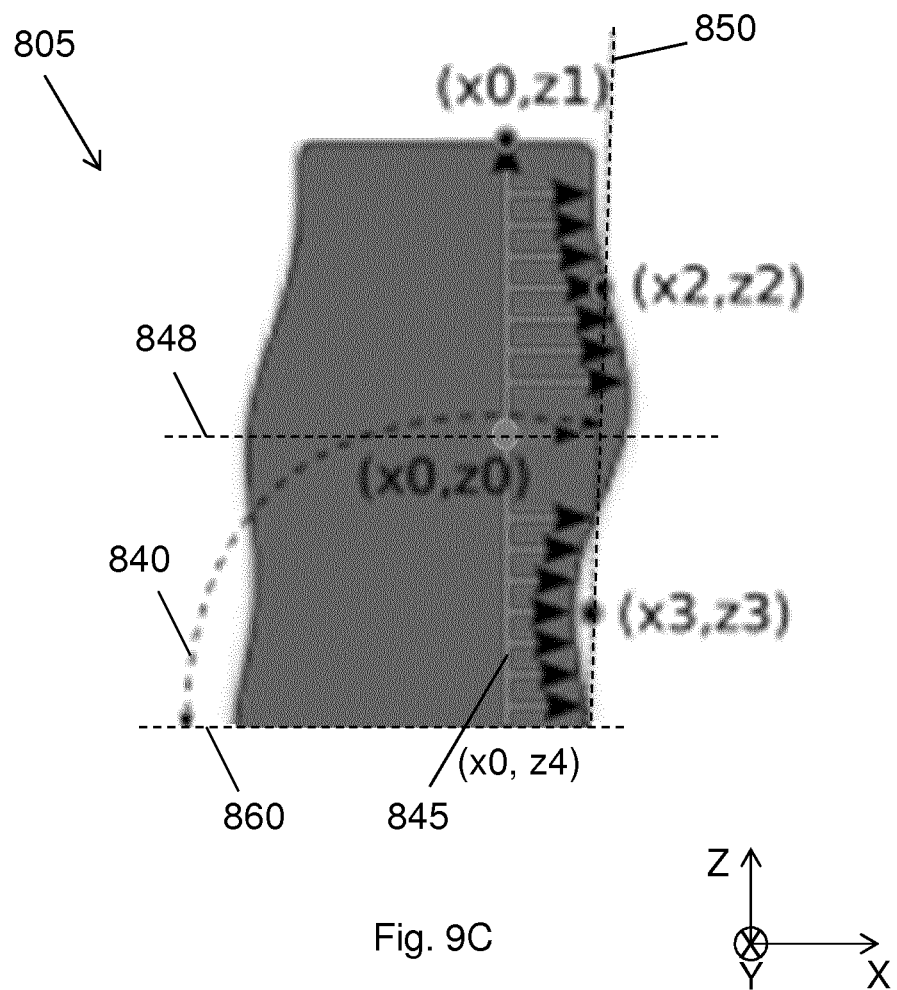
FIG. 9C depicts an example method of determining a sidewall angle parameter based on an aerial image.

In an embodiment, at least one parameter of the one or more parameters represents one or more characteristics of a lithographic pattern profile (e.g., an aerial image or a resist image of the transferred pattern) produced in the patterning process. Values of such at least one parameter may be determined based on one or more lithographic pattern profiles predicted/produced in the patterning process. The one or more pattern profiles may be simulated or measured based on the one or more design variables. In an embodiment, the lithographic pattern profile is an aerial image or a resist image. In an embodiment, such at least one parameter includes one or more selected from a standing wave parameter that characterizes the standing wave based on a resist image (as shown in FIG. 9A), a contrast variation parameter that characterizes contrast variation based on a resist image (as shown in FIG. 9B), a sidewall angle parameter that characterizes a left sidewall angle or a right sidewall angle based on an aerial image (as shown in FIG. 9C) or a resist image, a front end critical dimension (CD) parameter that characterizes the CD post development based on the resist image or a measurement, a footing parameter that characterizes variance at a foot of a structure based on the aerial image or the resist image, a resist loss parameter that characterizes resist loss post development based on the resist image, an asymmetry parameter that characterizes structural asymmetry (e.g., the difference between the left sidewall angle and the right sidewall angle or bottom surface tilt) based on the aerial image (as shown in FIG. 9C) or the resist image, etc.

In an embodiment, at least one parameter of the one or more parameters represents one or more characteristics of the etching process. In an embodiment, such at least one parameter includes one or more selected from a back end CD parameter that characterizes CD after etching based on a simulation or a measurement, a pattern placement parameter that characterizes pattern placement error after etching, a litho-etch bias parameter that characterizes litho-etch bias (i.e., the difference between the CD post etching and the CD post development), etc. The pattern placement error after etching can be caused by asymmetry of the lithographic pattern profile. Therefore, optimizing the pattern placement parameter can be equivalent to optimizing the asymmetry parameter as described above. In an embodiment, the litho-etch bias parameter is the difference between the back end CD parameter and the front end CD parameter. The litho-etch bias can be caused by the sidewall angle in the aerial image or the resist image. Therefore, optimizing the litho-etch bias parameter may be equivalent to optimizing the sidewall angle parameter as described above. In an embodiment, values of such at least one parameter is determined based on measurement or simulation using an etch model.

At step S505, a function (e.g., a cost function) is set up to find optimal values of the one or more design variables in respect of the one or more parameters. In an embodiment, the function, for the purpose of the optimization, includes one or more functions of $f_p(z_1, z_2, \ldots, z_N)$, each representing one of the one or more parameters as described at step S504. For example, in an embodiment, the function is used to optimize the one or more design variables $z_1, z_2, \ldots, z_N$ (N≥1) for only one parameter. As such, the cost function only includes a function $f_p(z_1, z_2, \ldots, z_N)$ that represents the one parameter. For another example, in an embodiment, the function is used to optimize the one or more design variables $z_1, z_2, \ldots, z_N$ (N≥1) for optimizing two or more parameters collectively. And, thus, in an embodiment, the function is a combination of two or more functions $f_p(z_1, z_2, \ldots, z_N)$ each representing one of the two or more parameters. In an embodiment, the function is a weighted combination of two or more functions $f_p(z_1, z_2, \ldots, z_N)$ each representing one of the parameters as in equation (1), i.e., the different parameters have a different weight.

At step S506, the function is expanded within a small enough neighborhood around a starting point value of the one or more design variables for a first iterative step (i=0).

At step S508, one or more pattern profiles corresponding to the set of values of the one or more design variables, i.e., $z_1, z_2, \ldots, z_N$ (N≥1), are obtained by either measurement or simulation. In an embodiment, each of the one or more pattern profiles is an aerial image (e.g., by measurement or simulation using a projection optics or resist model), a resist image (e.g., by measurement or simulation using a resist model), or an etch image (e.g., by measurement or simulation using an etch model). Using the one or more pattern profiles, a value of one or more parameters $f_p(z_1, z_2, \ldots, z_N)$ is determined.

At step S510, standard optimization techniques are applied to the function to find an optimal set of values of the one or more design variables, i.e., $(\tilde{z}_1, \tilde{z}_2, \ldots, \tilde{z}_N)$. In an embodiment, a cost function of equation (2) or (2') is used to obtain a robust patterning process so that the value of the cost function does not change much when the values of the one or more design variables are slightly deviated from $(\tilde{z}_1, \tilde{z}_2, \ldots, \tilde{z}_N)$, for example, due to systematic error or other unavoidable error. Note that the optimization problem can apply constraints, such as the one or more tuning ranges, during the optimization process at S510 or at a later stage in the optimization process.

At step 512, it is determined whether a predefined termination condition is satisfied. The predetermined termination condition may include various possibilities, e.g., one or more selected from: the function is minimized or maximized, as required by the numerical technique used, the value of the function is equal to a threshold value or crosses the threshold value, the value of the function reaches within a preset error limit, and/or a preset number of iterations is reached. In an embodiment, the termination condition can be whether one or more pattern profiles corresponding to a set of values of the one or more design variables satisfy one or more predetermined rules. An example rule is that the amount of resist loss according to the obtained pattern profile should be below a preset threshold. However, other suitable rules may be applied in addition or in alternative. If the predetermined termination condition is not satisfied, the process proceeds to step S516. At step S516, the values of the one or more design variables is updated with the result of the i-th iteration, and the process goes back to step S508. If the termination condition is satisfied, the process proceeds to step S518.

At step S518, a set of values of the one or more design variables, i.e., $(\tilde{z}_1, \tilde{z}_2, \ldots, \tilde{z}_N)$ is outputted. In an embodiment, a plurality of values (e.g., plurality of sets of values) of the one or more design variables may be output and ranked (e.g., using a performance indicator, such as one or more corresponding values of the one or more parameters or an indicator generated from a combination of the parameters) to enable selection. In addition or alternatively, at step S518, other data based on the set of values of the one or more design variables, are outputted. For example, at step S518, a pattern stack layout according to the set of values of the one or more design variables is generated and presented to a user on a display.

As noted above, in an embodiment, the method of patterning stack optimization in FIG. 8 is used to optimize the one or more design variables to enable patterning process robustness, i.e., when the values of the one or more design variables are deviated from $(\tilde{z}_1, \tilde{z}_2, \ldots, \tilde{z}_N)$, the value of a single parameter or a weighted combination of one or more parameters does not change much. However, given the set of values of the one or more design variables $(\tilde{z}_1, \tilde{z}_2, \ldots, \tilde{z}_N)$, the corresponding values of the one or more parameters may not be equal to the desired value. In an embodiment, the values of the one or more parameters may be retargeted to the desired value by tuning one or more variables other than the design variables $z_1, z_2, \ldots, z_N$, e.g., by changing a dose value in the lithographic process. Relatedly, the method of FIG. 5/FIG. 6 may be integrated with the method of FIG. 8. For example, when a patterning stack is optimized for robustness against variation (e.g., in a layer optical property and/or thicknesses), the pattern fidelity itself may need re-tuning (e.g., SMO, OPC, etc.) through, e.g. the method of FIG. 8. So, in an embodiment, for example, once an optimal or otherwise desired patterning stack is obtained through the method of FIG. 8, the values of one or more design variables determined in FIG. 5/FIG. 6 are reconsidered by performing the method of FIG. 5/FIG. 6. That is, a SMO, OPC or other related process may be performed based on the results of the method of FIG. 8. Additionally, in an embodiment, the method of FIG. 8 is then be re-performed based on the results of the method of FIG. 5/FIG. 6 and thus an iterative scheme arrives at one or more desired values, e.g., when a threshold is reached, such as the results between iterations not varying by 5% or more, 2% or more, 1% or more, etc. Additionally or alternatively, in an embodiment, the methods of FIG. 5/FIG. 6 and FIG. 8 are integrated into a co-optimization method. Thus, in these approaches, for example, the illumination, the patterning device pattern, and the patterning stack are optimized in, e.g., an iterative or co-optimization process that optimizes all three.

While a focus has been robustness to variation, the methods described herein are not so limited. For example, additionally or alternatively, pattern fidelity (e.g., CD, side wall angle (SWA), edge roughness, etc.) of pattern features to be patterned (or actually patterned) on the substrate can be targeted as part of the method. That is, for example, one or more pattern fidelity parameters can be optimized in addition to or alternatively to robustness to variation. For example, the patterning stack optimization can be integrated into SMO, OPC, etc. methods (e.g., co-optimization or an iterative process as discussed above). Accordingly, one or more nominal features to be patterned can be enhanced in addition to, or alternatively, being robustness to process variation.

An embodiment of an optimization process at step S510 is elaborated in more detail below. In an exemplary optimization process, no relationship between the design variables $(z_1, z_2, \ldots, z_N)$ and $f_p(z_1, z_2, \ldots, z_N)$ is assumed or approximated, except that $f_p(z_1, z_2, \ldots, z_N)$ is sufficiently smooth (e.g. first order derivatives $$\frac{\partial f_p(z_1, z_2, \ldots, z_N)}{\partial z_n},$$

(n=1,2, . . . N) exist), which is generally valid in a patterning process. An algorithm, such as the Gauss-Newton algorithm, the Levenberg-Marquardt algorithm, the Broyden-Fletcher-Goldfarb-Shanno algorithm, the gradient descent algorithm, the simulated annealing algorithm, the interior point algorithm, and the genetic algorithm, can be applied to find $(\tilde{z}_1, \tilde{z}_2, \ldots, \tilde{z}_N)$. In an embodiment, experimental data may be included in which case analysis of variance (ANOVA) and machine learning algorithms can be used to determine the corresponding f functions. In an embodiment, discrete parameters may be relevant such as for EUV illumination optimization. In such a case, discrete optimization algorithms such as "branch and bound" can be employed. Where multiple optima coexist, a Monte Carlo method may be employed, for example in a coarse exploratory step of the procedure.

Here, the Gauss-Newton algorithm is used as an example. The Gauss-Newton algorithm is an iterative method applicable to a general non-linear multi-variable optimization problem. In the i-th iteration wherein the design variables $(z_1, z_2, \ldots, z_N)$ take values of $(z_{1i}, z_{2i}, \ldots, z_{Ni})$, the Gauss-Newton algorithm linearizes $f_p(z_1, z_2, \ldots, z_N)$ in the vicinity of $(z_{1i}, z_{2i}, \ldots, z_{Ni})$, and then calculates values $(z_{1(i+1)}, z_{2(i+1)}, \ldots, z_{Z(i+1)})$ in the vicinity of $(z_{1i}, z_{2i}, \ldots, z_{Ni})$ that give a minimum of $CF(z_1, z_2, \ldots, z_N)$. The design variables $(z_1, z_2, \ldots, z_N)$ take the values of $(z_{1(i+1)}, z_{2(i+1)}, \ldots, z_{N(i+1)})$ in the (i+1)-th iteration. This iteration continues until convergence (i.e. $CF(z_1, z_2, \ldots, z_N)$ does not reduce any further) or a preset number of iterations is reached.

Specifically, in the i-th iteration, in the vicinity of $(z_{1i}, z_{2i}, \ldots, z_{Ni})$, $$f_p(z_1, z_2, \ldots, z_N) \approx f_p(z_{1i}, z_{2i}, \ldots, z_{Ni}) + \sum_{n=1}^{N} \left. \frac{\partial f_p(z_1, z_2, \ldots, z_N)}{\partial z_n} \right|_{z_1=z_{1i}, z_2=z_{2i}, \ldots z_N=z_{Ni}} (z_n - z_{ni}) \quad (Eq. 3)$$

Under the approximation of Eq. 3, the cost function becomes:

$$CF(z_1, z_2, \ldots, z_N) = \sum_{p=1}^{P} w_p f_p(z_1, z_2, \ldots, z_N) = \sum_{p=1}^{P} w_p (f_p(z_{1i}, z_{2i}, \ldots, z_{Ni}) + \sum_{n=1}^{N} \left. \frac{\partial f_p(z_1, z_2, \ldots, z_N)}{\partial z_n} \right|_{z_1=z_{1i}, z_2=z_{2i}, \ldots z_N=z_{Ni}} (z_n - z_{ni})) \quad (Eq. 4)$$

which is a quadratic function of the design variables $(z_1, z_2, \ldots, z_N)$. Every term is constant except the design variables $(z_1, z_2, \ldots, z_N)$.

If the design variables $(z_1, z_2, \ldots, z_N)$ are not under any constraints, $(z_{1(i+1)}, z_{2(i+1)}, \ldots, z_{N(i+1)})$ can be derived by solving N linear equations:

$$\frac{\partial CF(z_1, z_2, \ldots, z_N)}{\partial z_n} = \varepsilon',$$

wherein $n=1,2,\ldots,N$, and $\varepsilon'=0$ or $\varepsilon'$ is a small value deviated from zero. For example, $\varepsilon'=-0.1, -0.2, -0.01, 0, 0.01, 0.1, 0.2, 0.4$, etc.

If the design variables $(z_1, z_2, \ldots, z_N)$ are under constraints in the form of J inequalities (e.g. tuning ranges of $(z_1, z_2, \ldots, z_N)$) $\sum_{n=1}^{N} A_{nj} z_n \leq B_j$, for $j=1,2,\ldots,J$; and K equalities (e.g. interdependence between the design variables) $\sum_{n=1}^{N} C_{nk} z_n \leq D_k$, for $k=1,2,\ldots,K$, the optimization process becomes a classic quadratic programming problem, wherein $A_{nj}, B_j, C_{nk}, D_k$ are constants. Additional constraints can be imposed for each iteration. For example, a "damping factor" $\Delta_D$, can be introduced to limit the difference between $(z_{1(i+1)}, z_{2(i+1)}, \ldots, z_{N(i+1)})$ and $(z_{1i}, z_{2i}, \ldots, z_{Ni})$, so that the approximation of Eq. 3 holds. Such constraints can be expressed as $z_{ni} - \Delta_D \leq z_n \leq z_{ni} + \Delta_D$. $(z_{1(i+1)}, z_{2(i+1)}, \ldots, z_{N(i+1)})$ can be derived using, for example, methods described in Numerical Optimization (2nd ed.) by Jorge Nocedal and Stephen J. Wright (Berlin New York: Vandenberghe. Cambridge University Press).

Instead of minimizing the RMS of $f_p(z_1, z_2, \ldots, z_N)$, the optimization process can minimize magnitude of the largest deviation (the worst defect) among the characteristics to their intended values. In this approach, the cost function can alternatively be expressed as $$CF(z_1, z_2, \ldots, z_N) = \max_{1 \leq p \leq P} \frac{f_p(z_1, z_2, \ldots, z_N)}{CL_p} \quad (Eq. 5)$$

wherein $CL_p$ is the maximum allowed value for $f_p(z_1, z_2, \ldots, z_N)$. This cost function represents the worst defect among the characteristics. Optimization using this cost function minimizes magnitude of the worst defect. An iterative greedy algorithm can be used for this optimization.

The cost function of Eq. 5 can be approximated as:

$$CF(z_1, z_2, \ldots, z_N) = \sum_{p=1}^{P} w_p \left( \frac{f_p(z_1, z_2, \ldots, z_N)}{CL_p} \right)^q \quad (Eq. 6)$$

wherein q is an even positive integer such as at least 4, or at least 10. Eq. 6 mimics the behavior of Eq. 5, while allowing the optimization to be executed analytically and accelerated by using methods such as the deepest descent method, the conjugate gradient method, etc.

Minimizing the worst defect size can also be combined with linearizing of $f_p(z_1, z_2, \ldots, z_N)$. Specifically, $f_p(z_1, z_2, \ldots, z_N)$ is approximated as in Eq. 3. Then the constraints on worst defect size are written as inequalities $E_{Lp} \leq f_p(z_1, z_2, \ldots, z_N) \leq E_{Up}$, wherein $E_{Lp}$ and $E_{Up}$, are two constants specifying the minimum and maximum allowed deviation for the $f_p(z_1, z_2, \ldots, z_N)$. Plugging Eq. 3 in, these constraints are transformed to, for $p=1, \ldots P$, $$\sum_{n=1}^{N} \left. \frac{\partial f_p(z_1, z_2, \ldots, z_N)}{\partial z_n} \right|_{z_1=z_{1i}, z_2=z_{2i}, \ldots z_N=z_{Ni}} z_n \leq E_{Up} + \sum_{n=1}^{N} \left. \frac{\partial f_p(z_1, z_2, \ldots, z_N)}{\partial z_n} \right|_{z_1=z_{1i}, z_2=z_{2i}, \ldots z_N=z_{Ni}} z_{ni} - f_p(z_{1i}, z_{2i}, \ldots, z_{Ni}) \quad (Eq. 6')$$

and $$-\sum_{n=1}^{N} \left. \frac{\partial f_p(z_1, z_2, \ldots, z_N)}{\partial z_n} \right|_{z_1=z_{1i}, z_2=z_{2i}, \ldots z_N=z_{Ni}} z_n \leq -E_{Up} - \sum_{n=1}^{N} \left. \frac{\partial f_p(z_1, z_2, \ldots, z_N)}{\partial z_n} \right|_{z_1=z_{1i}, z_2=z_{2i}, \ldots z_N=z_{Ni}} z_{ni} + f_p(z_{1i}, z_{2i}, \ldots, z_{Ni}) \quad (Eq. 6'')$$

Since Eq. 3 is generally valid only in the vicinity of $(z_1, z_2, \ldots, z_N)$, in case the desired constraints $E_{Lp} \leq f_p(z_1,$ $z_2, \ldots, z_N) \leq E_{Up}$ cannot be achieved in such vicinity, which can be determined by any conflict among the inequalities, the constants $E_{Lp}$ and $E_{Up}$ can be relaxed until the constraints are achievable. This optimization process minimizes the worst defect size in the vicinity of $(z_1, z_2, \ldots, z_N)$, i. Then each step reduces the worst defect size gradually, and each step is executed iteratively until the terminating condition is met. This will lead to optimal reduction of the worst defect size.

Another way to minimize the worst defect is to adjust the weight $w_p$ in each iteration. For example, after the i-th iteration, if the r-th characteristic is the worst defect, $w_r$ can be increased in the (i+1)-th iteration so that the reduction of that characteristic's defect size is given higher priority.

In addition, the cost functions in Eq. 4 and Eq. 5 can be modified by introducing a Lagrange multiplier to achieve compromise between the optimization on RMS of the defect size and the optimization on the worst defect size, i.e., $$CF(z_1, z_2, \ldots, z_N) = (1-\lambda)\sum_{p=1}^{P} w_p f_p(z_1, z_2, \ldots, z_N) + \lambda \max_{1 \leq p \leq P} \frac{f_p(z_1, z_2, \ldots, z_N)}{CL_p} \quad \text{(Eq. 6''')}$$

where $\lambda$ is a preset constant that specifies the trade-off between the optimization on RMS of the defect size and the optimization on the worst defect size. In particular, if $\lambda=0$, then this becomes Eq. 4 and the RMS of the defect size is only minimized; while if $\lambda=1$, then this becomes Eq. 5 and the worst defect size is only minimized; if $0<\lambda<1$, then both are taken into consideration in the optimization. Such optimization can be solved using multiple methods. For example, the weighting in each iteration may be adjusted, similar to the one described previously. Alternatively, similar to minimizing the worst defect size from inequalities, the inequalities of Eq. 6' and 6'' can be viewed as constraints of the design variables during solution of the quadratic programming problem. Then, the bounds on the worst defect size can be relaxed incrementally or increase the weight for the worst defect size incrementally, compute the cost function value for every achievable worst defect size, and choose the design variable values that minimize the total cost function as the initial point for the next step. By doing this iteratively, the minimization of this new cost function can be achieved.

Optimizing a patterning process can expand a process window. A larger process window provides more flexibility in process design (e.g., device design, processing parameter values, etc.). The process window can be defined as, for example, a set of focus and dose values for which a parameter (e.g., CD, SWA or any profile related (geometric) parameter) of the aerial, resist or etch image is within a certain limit of the design target of the parameter. Note that the methods discussed herein may be extended to a more generalized process window definition that can be established by different or additional base parameters (two or more parameters) than exposure dose and defocus. These may include, but are not limited to, optical settings such as NA, sigma, aberration, polarization, or an optical constant of the resist layer. Thus, the process window defined on focus and dose values only serve as an example in this disclosure. If, for example, the process window (PW) comprises different patterning device pattern bias (mask bias), then the optimization can include the minimization of Mask Error Enhancement Factor (MEEF), which is defined as the ratio between the substrate edge placement error (EPE) and the induced patterning device pattern edge bias.

A method of maximizing a process window using, for example, dose and focus as its parameters, according to an embodiment, is described below. In a first step, starting from a known condition $(f_0, \varepsilon_0)$ in the process window, wherein $f_0$ is a nominal focus and $\varepsilon_0$ is a nominal dose, minimizing one of the cost functions below in the vicinity $(f_0 \pm \Delta f, \varepsilon_0 \pm \varepsilon)$:

$$CF(z_1, z_2, \ldots, z_N, f_0, \varepsilon_0) = \max_{(f,\varepsilon)=(f_0 \pm \Delta f, \varepsilon_0 \pm \varepsilon)} \max_p |f_p(z_1, z_2, \ldots, z_N, f, \varepsilon)| \quad \text{(Eq. 7)}$$

or $$CF(z_1, z_2, \ldots, z_N, f_0, \varepsilon_0) = \Sigma_{(f,\varepsilon)=(f_0 \pm \Delta f, \varepsilon_0 \pm \varepsilon)} \Sigma_p w_p f_p(z_1, z_2, \ldots, z_N, f, \varepsilon) \quad \text{(Eq. 7')}$$

or $$CF(z_1, z_2, \ldots, z_N, f_0, \varepsilon_0) = (1-\lambda)\Sigma_{(f,\varepsilon)=(f_0 \pm \Delta f, \varepsilon_0 \pm \varepsilon)} \Sigma_p w_p f_p(z_1, z_2, \ldots, z_N, f, \varepsilon) + \lambda \max_{(f,\varepsilon)=(f_0 \pm \Delta f, \varepsilon_0 \pm \varepsilon)} \max_p |f_p(z_1, z_2, \ldots, z_N, f, \varepsilon)| \quad \text{(Eq. 7'')}$$

If the nominal focus $f_0$ and nominal dose $E_0$ are allowed to shift, they can be optimized jointly with the design variables $(z_1, z_2, \ldots, z_N)$. In the next step, $(f_0 \pm \Delta f, \varepsilon_0 \pm \varepsilon)$ is accepted as part of the process window, if a set of values of $(z_1, z_2, \ldots, z_N, f, \varepsilon)$ can be found such that the cost function is within a preset limit.

If the focus and dose are not allowed to shift, the design variables $(z_1, z_2, \ldots, z_N)$ are optimized with the focus and dose fixed at the nominal focus f0 and nominal dose ε0. In an alternative embodiment, $(f_0 \pm \Delta f, \varepsilon_0 \pm \varepsilon)$ is accepted as part of the process window, if a set of values of $(z_1, z_2, \ldots, z_N)$ can be found such that the cost function is within a preset limit.

The methods described earlier in this disclosure can be used to minimize the respective cost functions of Eqs. 7, 7', or 7'' in order to, e.g., lead to process window maximization based on the optimization of the one or more design variables.

The optimization methods described above may be used to increase the throughput of a lithographic apparatus and/or an etching apparatus. For example, the function may include a function of $f_p(z_1, z_2, \ldots, z_N)$ that represents a patterning (e.g., exposure) time in the lithographic apparatus and/or a function of $f_p(z_1, z_2, \ldots, z_N)$ which represents the etching time in the etching apparatus. In an embodiment, optimization of such a function is constrained or influenced by a measure of the bandwidth or other metric.

As noted above, the values of parameters that represent various characteristics of the patterning process may be calculated based on a pattern profiles and by various methods. FIGS. 9A-9C depicts example methods of determining three different parameters based on pattern profiles.

FIG. 9A depicts an example method of determining a standing wave parameter based on a resist image 800. The resist image 800 may be obtained by simulation or measurement. A value of the standing wave parameter may be calculated based on the resist image 800. For example, a pixel 810 of the resist image 800 having maximum intensity is found. A cutline 820 along the Z direction that passes through the pixel 810 is identified on the resist image 800. The value of the standing wave parameter, $P_{sw}$ may then be calculated as:

$$P_{sw} = \frac{I_{max} - I_{min}}{I_{max} + I_{min}} \quad \text{(Eq. 8)}$$

where $I_{max}$ represents the maximum intensity of all the pixels along the cutline 820, and $I_{min}$ represents the minimal intensity of all the pixels along the cutline 820.

FIG. 9B depicts an example method of determining a contrast variation parameter based on the resist image 800. A value of the contrast variation parameter may be calculated based on the resist image 800. For example, a contrast value is calculated for each row, or a plurality of rows, of pixels of the resist image 800. Specifically, the contrast value, C, is calculated for an ith row 830 of pixels of the resist image 800 as follows:

$$C_i = \frac{I_{max,i} - I_{min,i}}{I_{max,i} + I_{min,i}} \quad \text{(Eq. 9)}$$

where $I_{max,i}$ represents the maximum intensity among the $i_{th}$ row 830 of pixels in the resist image 800, $I_{min,i}$ represents the minimum intensity among the $i_{th}$ row 830 of pixels in the resist image 800, and i=1,2,3, . . . , m assuming the resist image 800 includes (a total of) m rows of pixels.

The contrast variation parameter, $P_{ncv}$, of the resist image 800 may be calculated as:

$$P_{ncv} = \frac{\max(C_i, i = 1, 2, \ldots, m) - \min(C_i, i = 1, 2, \ldots, m)}{\max(C_i, i = 1, 2, \ldots, m)} \quad \text{(Eq. 10)}$$

where $\max(C_i, i=1,2, \ldots, m)$ represents the maximum contrast value among the m rows of pixels, and $\min(C_i, i=1,2, \ldots, m)$ represents the minimum contrast value among the m rows of pixels.

FIG. 9C depicts an example method of determining a sidewall angle parameter based on an aerial image 805. In an embodiment, the aerial image 805 may be obtained by simulation or measurement. In an embodiment, a similar process as shown in FIG. 9C may be applied to determine the sidewall angle parameter based on a resist image. The resist image may be simulated based on the aerial image 805 and based on a resist model. Or, the resist image may be obtained by measurement. As shown in FIG. 9C, a value of the sidewall angle parameter may be calculated based on the aerial image 805. For example, a vertical line 845 (i.e., a line along the Z direction) is determined to cross the top edge of the aerial image at a first coordinate $(x_0, z_1)$ and cross the bottom edge 860 of the aerial image at a second coordinate $(x_0, z_4)$. A third coordinate $(x_0, z_0)$ is determined about midway between the first coordinate and the second coordinate, where $z_0=(z_1+z_4)/2$. As such, a horizontal line 848 that passes through the third coordinate $(x_0,z_0)$ may divide the aerial image 805 into an upper half (i.e., above the line 848) and a lower half (i.e., below the line 848). An average distance between the sidewall and the vertical line 845 is then determined for the upper half and the lower half of the aerial image 805, respectively. Accordingly, a fourth coordinate $(x_2, z_2)$ and a fifth coordinate $(x_3, z_3)$ are determined so that the distance between the fourth coordinate $(x_2, z_2)$ and the vertical line 845 and the distance between the fifth coordinate $(x_3, z_3)$ and the vertical line 845 are equal to the determined average distances for the upper half of the aerial image 805 and the lower half of the aerial image 805, respectively. In an embodiment, the values of $z_2$ and $z_3$ may be any arbitrary values. A line 850 that passes through both the fourth coordinate $(x_2, z_2)$ and the fifth coordinate $(x_3, z_3)$ is then generated. A value of the sidewall angle parameter of the aerial image 805 is then determined as the angle 840 between the line 850 and the bottom edge 860 of the aerial image 805. It should be noted that the sidewall angle parameter in this example represents the right sidewall angle; the sidewall angle parameter may represent the left sidewall angle, the value of which may be calculated using a similar method as shown in FIG. 9C.

Figure 10:
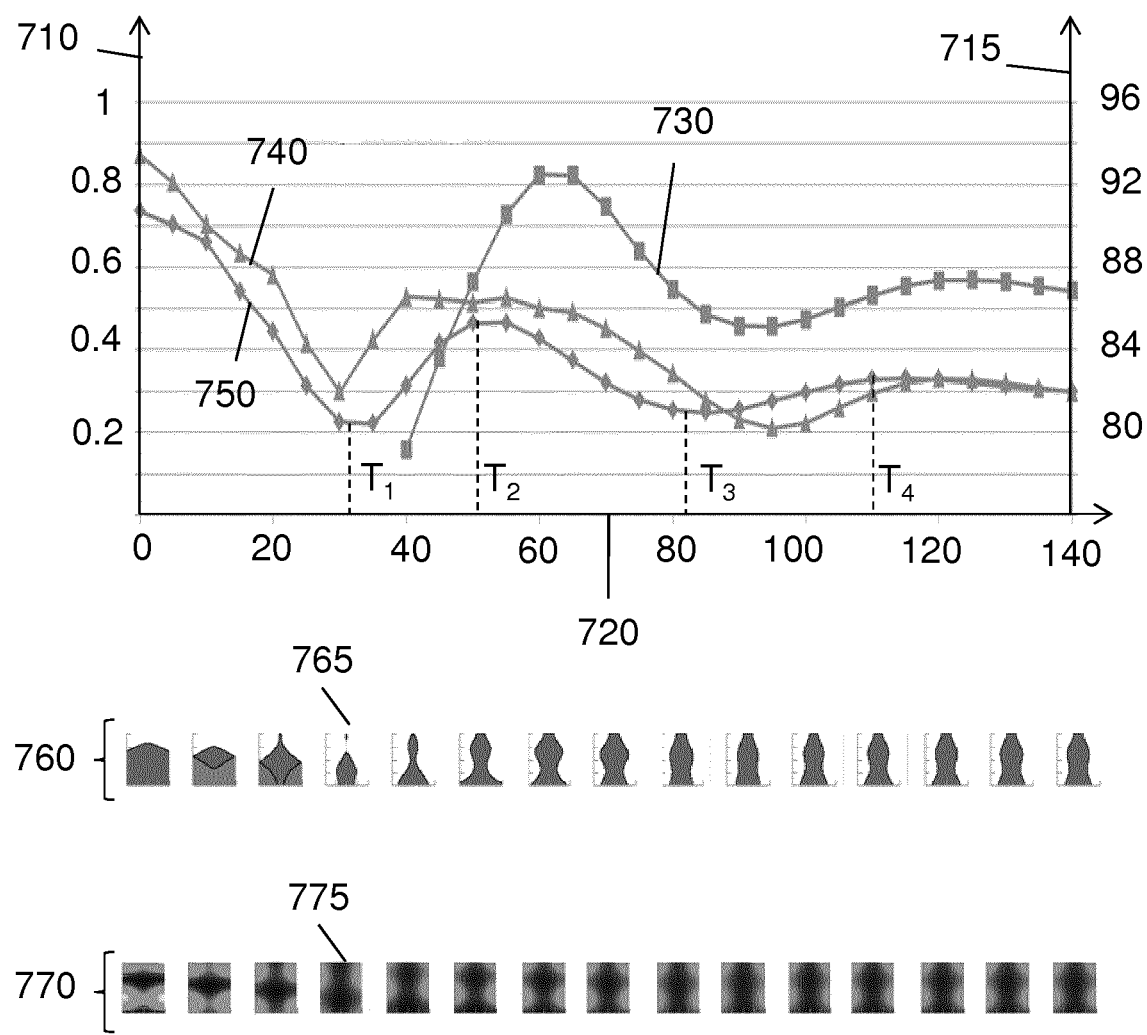
FIG. 10 depicts an example process of patterning stack optimization, according to an embodiment.

Referring to FIG. 10, an example process of patterning stack optimization is depicted. In the graph, the horizontal axis 720 represents a design variable selected from, for example, refractive index n, extinction coefficient k, or the thickness of a layer of the patterning stack (e.g., the patterning stack 660 in FIG. 7). Although there is only one design variable in FIG. 10, there might be two or more design variables as described above. Each of the vertical axes 710,715 may represent a parameter selected from, e.g., an alignment parameter, a leveling parameter, a standing wave parameter, a contrast variation parameter, a sidewall angle parameter, a front end CD parameter, a footing parameter, a resist loss parameter, an asymmetry parameter, a back end CD parameter, a pattern placement parameter, and/or a litho-etch bias parameter as described above. As an example, the horizontal axis 720 represents the thickness of the BARC layer of the patterning stack. The first vertical axis 710 represents a contrast variation parameter (e.g., a unitless normalized value) and a standing wave parameter (e.g. a unitless normalized value). Accordingly, data points representing values of the contrast variation parameter and the standing wave parameter respectively as a function of variation of the thickness of the BARC layer are connected as shown by swing curves 740 and 750, respectively as shown in FIG. 10. Additionally, the second vertical axis 715 represents a sidewall angle parameter (e.g., angle in degrees). Accordingly, the data points representing values of the sidewall angle parameter as a function of variation of the thickness of the BARC layer are connected as shown by a swing curve 730. As described in relation to FIGS. 9A-9C, each value of the swing curves 740, 750, and 730 may be calculated based on a patterning profile (i.e., an aerial image or a resist image). Specifically, the contrast variation parameter represented by the swing curve 740 and the standing wave parameter represented by the swing curve 750 may be calculated based on the resist images 770 as described in respect of FIGS. 9A and 9B. The sidewall angle parameter represented by the swing curve 730 may be calculated based on the aerial image 760 as described in respect of FIG. 9C.

In an embodiment, each of the swing curves may be fitted and represented by a function of $f_p(z_1)$, where $z_1$ is the design parameter (e.g., the thickness of the BARC layer) represented by the horizontal axis 720. For example, the swing curve 740 that represents the contrast variation parameter may be fitted and represented by $f_1(z_1)$, the swing curve 750 that represents the standing wave parameter may be fitted and represented by $f_2(z_1)$, and the swing curve 730 that represents the sidewall angle parameter may be fitted and represented by $f_3(z_1)$.

In an embodiment, a function (e.g., a cost function) includes one or more functions $f_i(z_1)$ (i=1, 2, or 3) depending on the purpose of optimization. In an embodiment, the function includes two or more functions $f_i(z_1)$ to optimize the design variable $z_1$ for the corresponding two or more parameters collectively. In an embodiment, the function includes only one of the functions $f_1(z_1)$, $f_2(z_1)$, and $f_3(z_1)$ to optimize the design variable $z_1$ for either the contrast variation parameter, the standing wave parameter, or the sidewall angle parameter. A standard optimization method as described above may be applied to the function to find a set of values for the design variable $z_1$ so that the function has, e.g., a value with a local extrema (i.e., local maximum or local minimum) or within a range around the local extrema given the set of values. The range is used, for example, so that the value of the function does not change much when the value of the design variable is slightly deviated from the nominal value, e.g., due to an unavoidable systematic error; thus, a robust process with respect to the one or more parameters that are represented in the function can be obtained. In an embodiment, the set of values for the design variable $z_1$ may be determined by solving the equation:

$$\frac{\partial CF(z_1)}{\partial z_1} = 0 \quad \text{(Eq. 11)}$$

or $$\frac{\partial CF(z_1)}{\partial z_1} = \varepsilon', \quad \text{(Eq. 12)}$$

wherein $CF(z_1)$ represents a cost function and $\varepsilon'$ is a preset value deviated from zero.

For example, the function may only include $f_2(z_1)$ that represents the standing wave parameter. So, having regard to FIG. 10, an optimal value for the design variable $z_1$ may be $T_1$, $T_2$, $T_3$, and $T_4$, or may be a small range of values around $T_1$, $T_2$, $T_3$, and $T_4$ that results in a robust process with respect to the standing wave parameter. But, the aerial image 765 in accordance with the value of the design variable at $T_1$ may not satisfy a preset rule. For example, aerial image 765 indicates a significant resist loss. As a result, the value of $T_1$ may be discarded. The values $T_2$, $T_3$, and $T_4$, or a small range of values around $T_2$, $T_3$, $T_4$ may be included in the outputted set of values for the design variable $z_1$. Practically, when the design variable $z_1$ represents a thickness of a layer, the user may select $T_3$ or a number within the small range around $T_3$ for the design variable (e.g., the thickness of the BARC layer) in the patterning stack, since it provides a local minimum of standing wave. But, as can be seen in FIG. 10, $T_3$ does not represent a local minimum or maximum for contrast variation and does not provide a 90 degree sidewall angle. Thus, in an embodiment, the function includes one or more other parameters (e.g., contrast variation and/or sidewall angle) to arrive at an optimum value of design variable $z_1$ (e.g., thickness of a patterning stack layer).

As described above, there may be only one design variable in the pattern stack optimization. Accordingly, a plurality of aerial images 760 or resist images 770 in accordance with different values of the design variable are obtained in the optimization process, e.g., to determine the values of the one or more parameters represented in the cost function. In some other examples, there might be two or more design variables in the patterning stack optimization. Accordingly, a plurality of aerial images or resist images in accordance with different values of the one or more design variables may be determined. For example, the one or other design variables can be of a different type and/or for a different layer in the patterning stack.

Figure 11:
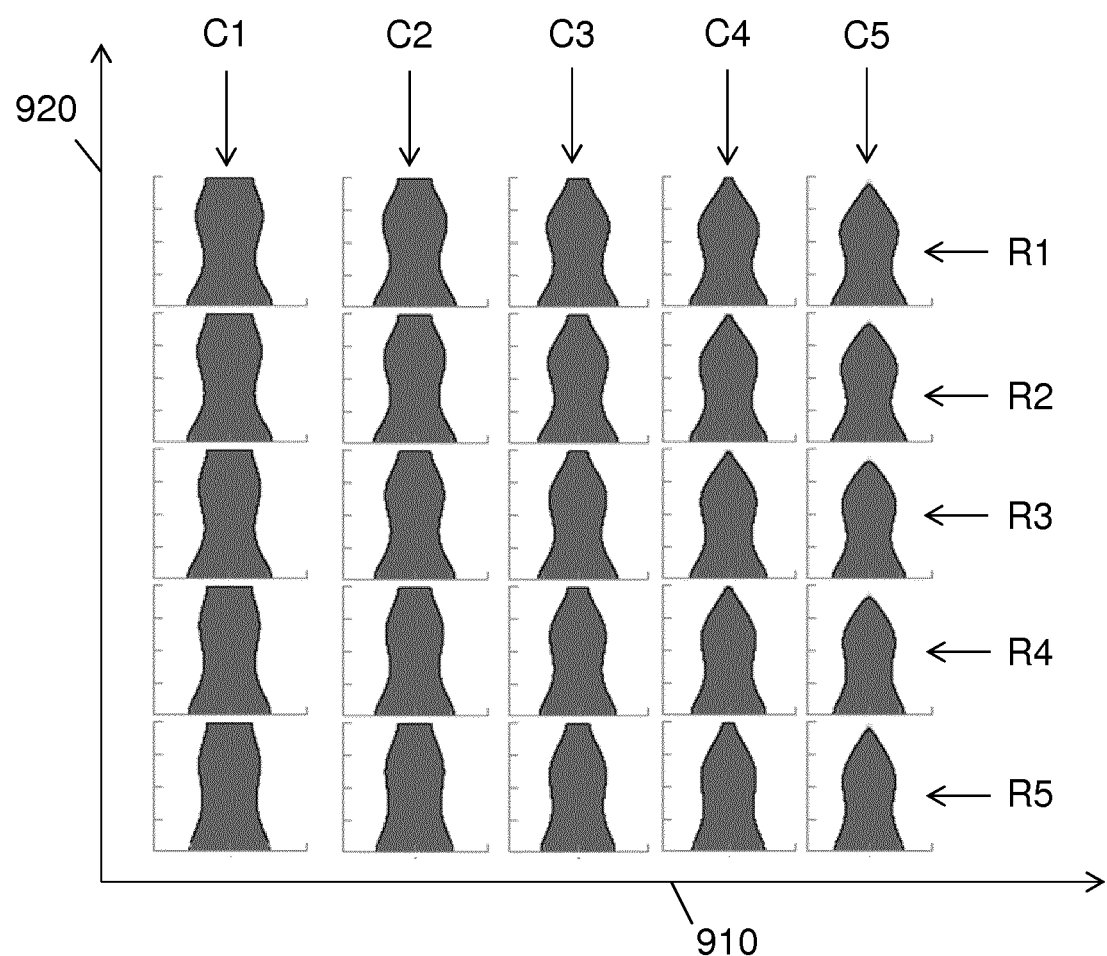
FIG. 11 depicts a simulation of a plurality of aerial images in accordance with two design variables.

FIG. 11 depicts an example of a plurality of resist images in accordance with two design variables. As shown in FIG. 11, the horizontal axis 910 represents a first design variable, and the vertical axis 920 represents a second design variable. Each of the first design variable and the second design variable may be selected from, for example, refractive index n, extinction coefficient k, and/or thickness of a layer of the patterning stack (e.g., the patterning stack 660 in FIG. 7). By example, the horizontal axis 910 represents a thickness of the BARC layer (e.g., the BARC layer 630), and the vertical axis 920 represents a thickness of the resist layer (e.g., the resist layer 640). Accordingly, a plurality of resist images corresponding to different thicknesses of the BARC layer and the resist layer is obtained by either simulation or measurement. As shown, the plurality of resist images are arranged in a two dimensional array. Each column (i.e., each of $C_1$-$C_5$) of the resist images corresponds to the same value of the first design variable (e.g., the thickness of the BARC layer), and each row (i.e., each of $R_1$-$R_5$) of the resist images corresponds to the same value of the second design variable (e.g., the thickness of the resist layer). Although not shown, a plurality of aerial images may be used instead or additionally. As discussed above, a value of each parameter related to the patterning profiles and represented in a function for optimization may be calculated based on each of the aerial images or resist images. Using a standard optimization technique as described above, the two design variables (e.g., the thickness of the BARC layer and the thickness of the resist layer) may be optimized and finally outputted.

So, in an embodiment, the resulting pattern profile (e.g., in resist) is taken into account when optimizing the patterning stack. In an embodiment, there is a co-optimization between process robustness and pattern profile. To do so, in an embodiment, the pattern profile (e.g., resist pattern profile) is determined (e.g., by simulation) given pertinent process conditions (e.g., applicable illumination, applicable pattern being transferred, applicable initial patterning stack design variables (such as material types and starting thicknesses), etc.). In an embodiment, one or more parameters describing a resist profile (as a form of the pattern profile) are determined from a standing wave generated in the resist, which standing wave results from the optical properties of the patterning stack and the illumination setting and wavelength of the exposure radiation. But, in an embodiment, one or more parameters describing the pattern profile can be determined using a more accurate model (such as a physical model, e.g., the Hyperlith software) that captures more factors, such as the impact on the profile of post-exposure bake, develop, etc.

To enable the optimization, the sensitivity of the pattern profile to one or more adjustable design variables of the stack are generally found. In an embodiment, values of the one or more design variables (e.g., thickness of a BARC layer, a resist layer and/or a top coat layer, type of material of a layer, refractive index of a layer, extinction coefficient of a layer, photoactive compound or quencher concentration through the resist height (e.g., by adding an acid or base to the BARC layer (for footing issues) or topcoat (for top rounding), etc.) are varied and values of one or more parameters pertaining to the pattern profile (e.g., standing wave, contrast variation, sidewall angle, CD, etc.) are obtained. In an embodiment, the values of the one or more parameters are obtained by simulation (e.g., aerial image simulation), which can be experimentally verified.

And, so in an embodiment, by varying the one or more design variables, an optimal one or more values of the one or more parameters pertaining to the pattern profile are obtained. The optimum one or more parameters can be a combination of parameters, wherein a weighting can be applied. The result of the optimization could be an optimal resist profile for the nominal patterning conditions. The optimization criteria can vary. For example, a variation of a pattern profile will give rise to varying litho-etch bias. So, it may be desirable to have a substantially same litho-etch bias for a range of pitches/features. In an embodiment, the optimization criteria can include one or more selected from: minimal top-rounding, minimal footing, and/or sidewall angle (SWA) of at or near 90°.

In an embodiment, the method provides a model based optimization of a patterning stack that takes into account one or more selected from (desirably two or more selected from): measurement sensor performance (e.g., alignment, leveling), metrology impact (e.g., CD, overlay, dose, etc. measurement apparatus), imaging CD, pattern profile, pattern placement, etch proximity effects in pattern shift, litho-etch bias, etch parameters (e.g., etch selectivity, etch rate, etc.), resist development parameters, and/or post-exposure bake parameters. The electrical or device function performance requirements could be included in the optimization. But, in an embodiment, they are excluded and those requirements drive the types of materials, while the optimization addresses other parameters (e.g., thickness, refractive index, etc.).

So, in an embodiment, there is provided an optimization toolset that uses as input the materials chosen for the patterning stack (e.g., chosen for reasons of device function (e.g., electrical properties) and/or chosen for an etch requirement (e.g., etch selectivity, etch rate)). With the stack materials specified, one or more patterning stack variables can be varied, wherein the patterning stack variables represent a physical characteristic of one or more layers of the patterning stack. For example, a patterning stack variable can be a thickness of a layer or a plurality of layers. Moreover, there can be a plurality of patterning stack variables, such as one for each layer of a plurality of layers of the patterning stack. Further, there can be different types of patterning stack variables (e.g., refractive index and thickness). Then, the one or more patterning stack variables are varied (e.g., where there is a plurality of patterning stack variables each representing a thickness of a different layer, then varying the thickness of the layers). In an embodiment, the varying can be performed in a Monte Carlo fashion. For each of the one or more varied patterning stack variable, one or more parameter selected from the following can be determined by using a pertinent model and/or measurement: a parameter representing the impact on performance of a sensor (e.g., level sensor, alignment sensor, overlay, dose, CD metrology apparatus, a parameter representing the impact on resist CD, pattern profile, and/or pattern placement, a parameter representing the impact on the pattern and profile in resist, and/or a parameter representing the impact on an etched pattern. Then using the above, an optimal value of the one or more patterning stack variables can be determined. For example, a key performance indicator can be identified or assigned to determined values of the one or more patterning stack variables and the one or more parameters and then the key performance indicator can be ranked so as to rank the values of the one or more patterning stack variables in terms of what can be considered optimal (e.g. optimal pattern placement, optimal pattern CD after etch and/or robustness to patterning stack variation).

So, in an embodiment, control over the pattern profile in resist through selection of an appropriate value of one or more design variable can enable, for example, optimizing patterning rather than merely configuring a stack for imaging. Further, this process of arriving an appropriate value of one or more design variables can provide optimization of an after etch critical dimension uniformity. Thus, this process can enable tackling of problems associated with pattern profile at the root.

In an embodiment, the techniques herein assist in the task of patterning integration. In an embodiment, the techniques help in reducing the total time for achieving a satisfactory patterning stack. In an embodiment, the techniques help reduce an enormous amount of experimental work involved by using a more model based approach (which can assist in reducing cost). In an embodiment, the techniques take into account more aspects that constitute a proper stack, e.g., an impact of the stack on metrology is not taken into account or not taken into account in initial design of the patterning stack. In an embodiment, the techniques make the process of coming to a proper patterning stack more quantitative so that it should be possible to reach a more optimal end-point.

In an embodiment, there is provided a method of optimizing a patterning stack, the method comprising: defining a function that measures how a parameter representing a physical characteristic pertaining to a pattern transferred into a patterning stack on a substrate is affected by change in a patterning stack variable, the patterning stack variable representing a physical characteristic of a material layer of the patterning stack; varying, by a hardware computer system, the patterning stack variable and evaluating, by the hardware computer system, the function with respect to the varied patterning stack variable, until a termination condition is satisfied; and outputting a value of the patterning stack variable when the termination condition is satisfied.

In an embodiment, the patterning stack variable is one or more selected from: a refractive index of a layer of the patterning stack, an extinction coefficient of a layer of the patterning stack, and/or a thickness of a layer of the patterning stack. In an embodiment, the parameter represents one or more selected from: a physical characteristic of a metrology process, a physical characteristic of a lithographic process, and/or a physical characteristic of an etch process. In an embodiment, the parameter is one or more selected from: an alignment parameter, a leveling parameter, a metrology parameter, a standing wave parameter, a contrast variation parameter, a sidewall angle parameter, a front end critical dimension parameter, a footing parameter, a resist loss parameter, an asymmetry parameter, a back end critical dimension parameter, a pattern placement parameter, a top rounding parameter and/or a litho-etch bias parameter. In an embodiment, the function measures how a plurality of parameters each representing a physical characteristic pertaining to the pattern transferred into the patterning stack on the substrate is affected by change in the patterning stack variable. In an embodiment, the plurality of parameters comprises a physical characteristic of a metrology process. In an embodiment, the evaluating the function with respect to the varied patterning stack variable comprises performing a computer simulation to determine a value of the parameter based on the varied patterning stack variable. In an embodiment, the parameter comprises a physical characteristic of an etch process and the computer simulation employs an etch model. In an embodiment, the parameter comprises a physical characteristic of a metrology process and the computer simulation employs a metrology model. In an embodiment, the parameter comprises a physical characteristic of a lithographic process and the computer simulation employs a resist model. In an embodiment, the evaluating the function with respect to the varied patterning stack variable comprises determining a value for the parameter based on a pattern profile obtained by measurement or simulation. In an embodiment, the pattern profile is either a resist image or an etch image. In an embodiment, the evaluating the function with respect to the varied patterning stack variable comprises determining a value for a parameter representing of a physical characteristic a measurement process by measurement or simulation. In an embodiment, the function is a cost function and evaluating the function comprising obtaining a value of the patterning stack variable such the cost function has a value of the parameter at a local extrema or within a preset range around the local extrema value.

In an embodiment, there is provided a method comprising: optimizing, by a hardware computer system, a patterning stack variable, the patterning stack variable representing a physical characteristic of a material layer of a patterning stack on a substrate, with respect to a plurality of parameters each representing a physical characteristic pertaining to a pattern transferred into the patterning stack on the substrate, until a termination condition is satisfied; and outputting a value of the patterning stack variable when the termination condition is satisfied.

In an embodiment, the patterning stack variable is one or more selected from: a refractive index of a layer of the patterning stack, an extinction coefficient of a layer of the patterning stack, and/or a thickness of a layer of the patterning stack. In an embodiment, at least one of the parameters represents one or more selected from: a physical characteristic of a metrology process, a physical characteristic of a lithographic process, and/or a physical characteristic of an etch process. In an embodiment, the parameters comprise one or more selected from: an alignment parameter, a leveling parameter, a metrology parameter, a standing wave parameter, a contrast variation parameter, a sidewall angle parameter, a front end critical dimension parameter, a footing parameter, a resist loss parameter, an asymmetry parameter, a back end critical dimension parameter, a pattern placement parameter, a top rounding parameter and/or a litho-etch bias parameter. In an embodiment, the parameters comprise at least parameter representing a physical characteristic of a metrology process. In an embodiment, the optimizing comprises performing a computer simulation to determine values of the parameters based on the patterning stack variable. In an embodiment, at least one of the parameters represents a physical characteristic of an etch process and the computer simulation employs an etch model. In an embodiment, at least one of the parameters represents a physical characteristic of a metrology process and the computer simulation employs a metrology model. In an embodiment, at least one of the parameters represents a physical characteristic of a lithographic process and the computer simulation employs a resist model. In an embodiment, the optimizing comprises determining a value for at least one of the parameters based on a pattern profile obtained by measurement or simulation. In an embodiment, the pattern profile is either a resist image or an etch image. In an embodiment, the optimizing comprises determining a value for at least one of the parameters representing a physical characteristic of a measurement process by measurement or simulation. In an embodiment, the optimizing involves evaluating a cost function to obtain a value of the patterning stack variable such the cost function has a value of the parameters at a local extrema or within a preset range around the local extrema value. In an embodiment, the method further comprises optimizing the plurality of parameters for a plurality of patterning stack variables. In an embodiment, the plurality of patterning stack variables comprises patterning stack variables each for different layers of the patterning stack.

Figure 12:
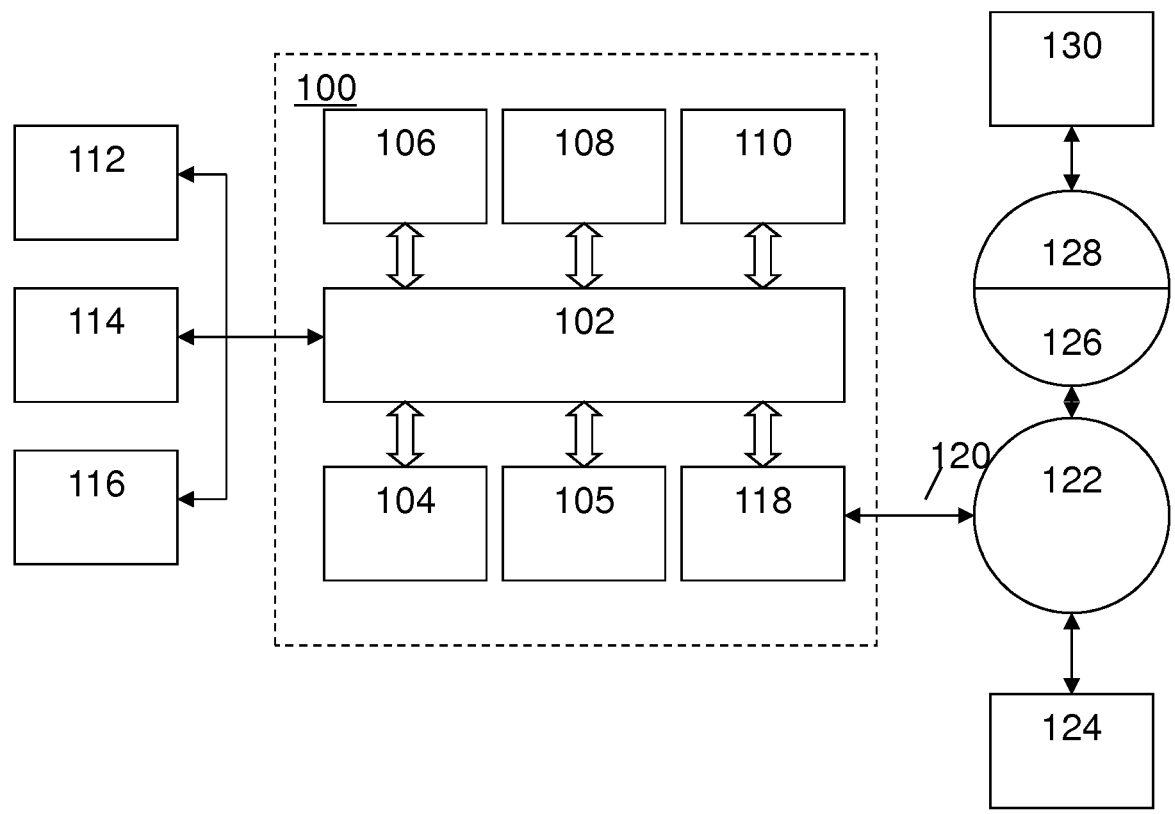
FIG. 12 is a block diagram of an example computer system.

FIG. 12 is a block diagram that illustrates a computer system 100 which can assist in implementing the methods and flows disclosed herein. The computer system 100 may be incorporated into a lithographic apparatus, into a metrology apparatus, be a stand-alone system, or be a separate system connected to a lithographic or metrology apparatus. In an embodiment, computer system 100 includes a bus 102 or other communication mechanism to communicate information, and a processor 104 (or multiple processors 104 and 105) coupled with bus 102 to process information. In an embodiment, computer system 100 includes a main memory 106, such as a random access memory (RAM) or other dynamic storage device, coupled to bus 102 to store information and instructions to be executed by processor 104. Main memory 106 also may be used for storing temporary variables or other intermediate information during execution of instructions to be executed by processor 104. In an embodiment, computer system 100 includes a read only memory (ROM) 108 or other static storage device coupled to bus 102 to store static information and instructions for processor 104. A storage device 110, such as a magnetic disk or optical disk, is provided and coupled to bus 102 for storing information and instructions.

Computer system 100 may be coupled via bus 102 to a display 112, such as a cathode ray tube (CRT) or flat panel or touch panel display for displaying information to a computer user. An input device 114, including alphanumeric and other keys, is coupled to bus 102 for communicating information and command selections to processor 104. Another type of user input device is cursor control 116, such as a mouse, a trackball, or cursor direction keys for communicating direction information and command selections to processor 104 and for controlling cursor movement on display 112. A touch panel (screen) display may also be used as an input device.

According to one embodiment, portions of a method and/or flow described herein may be performed by computer system 100 in response to processor 104 executing one or more sequences of one or more instructions contained in main memory 106. Such instructions may be read into main memory 106 from another computer-readable medium, such as storage device 110. Execution of the sequences of instructions contained in main memory 106 causes processor 104 to perform the process steps described herein. One or more processors in a multi-processing arrangement may also be employed to execute the sequences of instructions contained in main memory 106. In an alternative embodiment, hard-wired circuitry may be used in place of or in combination with software instructions. Thus, the description herein is not limited to any specific combination of hardware circuitry and software.

The term "computer-readable medium" as used herein refers to any medium that participates in providing instructions to processor 104 for execution. Such a medium may take many forms, including but not limited to, non-volatile media, volatile media, and transmission media. Non-volatile media include, for example, optical or magnetic disks, such as storage device 110. Volatile media include dynamic memory, such as main memory 106. Transmission media include coaxial cables, copper wire and fiber optics, including the wires that comprise bus 102. Transmission media can also take the form of acoustic or light waves, such as those generated during radio frequency (RF) and infrared (IR) data communications. Common forms of computer-readable media include, for example, a floppy disk, a flexible disk, hard disk, magnetic tape, any other magnetic medium, a CD-ROM, DVD, any other optical medium, punch cards, paper tape, any other physical medium with patterns of holes, a RAM, a PROM, and EPROM, a FLASH-EPROM, any other memory chip or cartridge, a carrier wave as described hereinafter, or any other medium from which a computer can read.

Various forms of computer readable media may be involved in carrying one or more sequences of one or more instructions to processor 104 for execution. For example, the instructions may initially be borne on a magnetic disk of a remote computer. The remote computer can load the instructions into its dynamic memory and send the instructions over a telephone line using a modem. A modem local to computer system 100 can receive the data on the telephone line and use an infrared transmitter to convert the data to an infrared signal. An infrared detector coupled to bus 102 can receive the data carried in the infrared signal and place the data on bus 102. Bus 102 carries the data to main memory 106, from which processor 104 retrieves and executes the instructions. The instructions received by main memory 106 may optionally be stored on storage device 110 either before or after execution by processor 104.

Computer system 100 may also include a communication interface 118 coupled to bus 102. Communication interface 118 provides a two-way data communication coupling to a network link 120 that is connected to a local network 122. For example, communication interface 118 may be an integrated services digital network (ISDN) card or a modem to provide a data communication connection to a corresponding type of telephone line. As another example, communication interface 118 may be a local area network (LAN) card to provide a data communication connection to a compatible LAN. Wireless links may also be implemented. In any such implementation, communication interface 118 sends and receives electrical, electromagnetic or optical signals that carry digital data streams representing various types of information.

Network link 120 typically provides data communication through one or more networks to other data devices. For example, network link 120 may provide a connection through local network 122 to a host computer 124 or to data equipment operated by an Internet Service Provider (ISP) 126. ISP 126 in turn provides data communication services through the worldwide packet data communication network, now commonly referred to as the "Internet" 128. Local network 122 and Internet 128 both use electrical, electromagnetic or optical signals that carry digital data streams. The signals through the various networks and the signals on network link 120 and through communication interface 118, which carry the digital data to and from computer system 100, are exemplary forms of carrier waves transporting the information.

Computer system 100 can send messages and receive data, including program code, through the network(s), network link 120, and communication interface 118. In the Internet example, a server 130 might transmit a requested code for an application program through Internet 128, ISP 126, local network 122 and communication interface 118. The received code may be executed by processor 104 as it is received, and/or stored in storage device 110, or other non-volatile storage for later execution. In this manner, computer system 100 may obtain application code in the form of a carrier wave.

Figure 13:
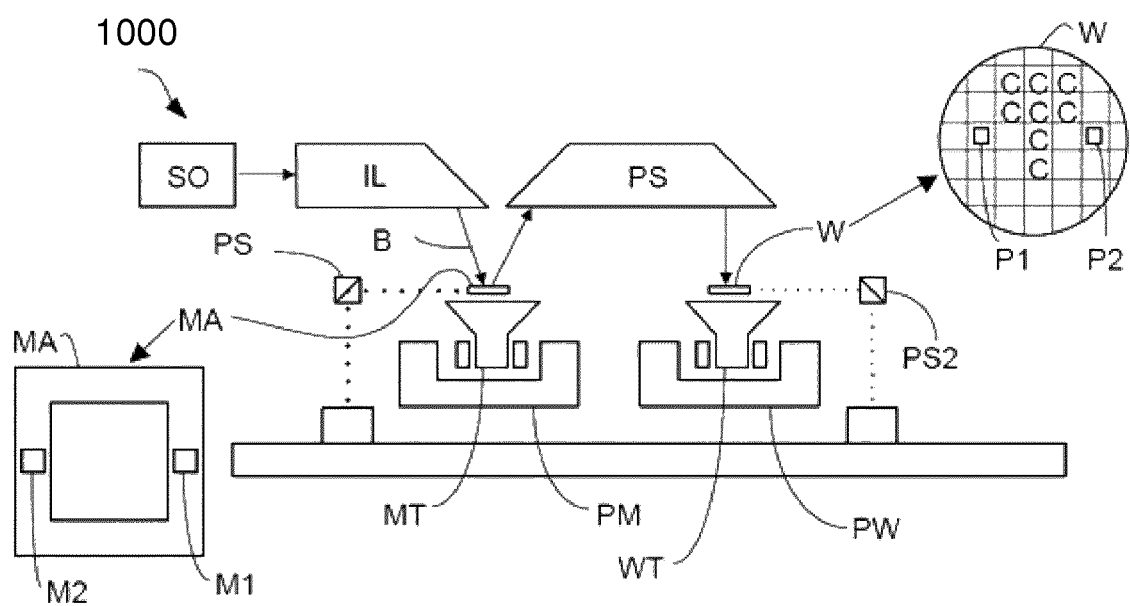
FIG. 13 is a schematic diagram of an example lithographic projection apparatus.

FIG. 13 schematically depicts another exemplary lithographic projection apparatus. The lithographic projection apparatus 1000 comprises:
  a source collector module SO
  an illumination system (illuminator) IL configured to condition a radiation beam B (e.g. EUV radiation).
  a support structure (e.g. a patterning device table) MT constructed to support a patterning device (e.g. a mask or a reticle) MA and connected to a first positioner PM configured to accurately position the patterning device;
  a substrate table (e.g. a wafer table) WT constructed to hold a substrate (e.g. a resist coated wafer) W and connected to a second positioner PW configured to accurately position the substrate; and
  a projection system (e.g. a reflective projection system) PS configured to project a pattern imparted to the radiation beam B by patterning device MA onto a target portion C (e.g. comprising one or more dies) of the substrate W.

As here depicted, the apparatus 1000 is of a reflective type (e.g. employing a reflective patterning device). It is to be noted that because most materials are absorptive within the EUV wavelength range, the patterning device may have multilayer reflectors comprising, for example, a multi-stack of Molybdenum and Silicon. In one example, the multi-stack reflector has a 40 layer pairs of Molybdenum and Silicon where the thickness of each layer is a quarter wavelength. Even smaller wavelengths may be produced with X-ray lithography. Since most material is absorptive at EUV and x-ray wavelengths, a thin piece of patterned absorbing material on the patterning device topography (e.g., a TaN absorber on top of the multi-layer reflector) defines where features would print (positive resist) or not print (negative resist).

Referring to FIG. 13, the illuminator IL receives an extreme ultra violet radiation beam from the source collector module SO. Methods to produce EUV radiation include, but are not necessarily limited to, converting a material into a plasma state that has at least one element, e.g., xenon, lithium or tin, with one or more emission lines in the EUV range. In one such method, often termed laser produced plasma ("LPP") the plasma can be produced by irradiating a fuel, such as a droplet, stream or cluster of material having the line-emitting element, with a laser beam. The source collector module SO may be part of an EUV radiation system including a laser, not shown in FIG. 13, for providing the laser beam exciting the fuel. The resulting plasma emits output radiation, e.g., EUV radiation, which is collected using a radiation collector, disposed in the source collector module. The laser and the source collector module may be separate entities, for example when a $CO_2$ laser is used to provide the laser beam for fuel excitation.

In such cases, the laser is not considered to form part of the lithographic projection apparatus and the radiation beam is passed from the laser to the source collector module with the aid of a beam delivery system comprising, for example, suitable directing mirrors and/or a beam expander. In other cases the source may be an integral part of the source collector module, for example when the source is a discharge produced plasma EUV generator, often termed as a DPP source.

The illuminator IL may comprise an adjuster for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as faceted field and pupil mirror devices. The illuminator may be used to condition the radiation beam, to have a desired uniformity and intensity distribution in its cross section.

The radiation beam B is incident on the patterning device (e.g., mask) MA, which is held on the support structure (e.g., patterning device table) MT, and is patterned by the patterning device. After being reflected from the patterning device (e.g. mask) MA, the radiation beam B passes through the projection system PS, which focuses the beam onto a target portion C of the substrate W. With the aid of the second positioner PW and position sensor PS2 (e.g. an interferometric device, linear encoder or capacitive sensor), the substrate table WT can be moved accurately, e.g. so as to position different target portions C in the path of the radiation beam B. Similarly, the first positioner PM and another position sensor PS1 can be used to accurately position the patterning device (e.g. mask) MA with respect to the path of the radiation beam B. Patterning device (e.g. mask) MA and substrate W may be aligned using patterning device alignment marks M1, M2 and substrate alignment marks P1, P2.

The depicted apparatus 1000 could be used in at least one of the following modes:

1. At step mode, the support structure (e.g. patterning device table) MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed.

2. In scan mode, the support structure (e.g. patterning device table) MT and the substrate table WT are scanned synchronously while a pattern imparted to the radiation beam is projected onto a target portion C (i.e. a single dynamic exposure). The velocity and direction of the substrate table WT relative to the support structure (e.g. patterning device table) MT may be determined by the (de-) magnification and image reversal characteristics of the projection system PS.

3. In another mode, the support structure (e.g. patterning device table) MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Figure 14:
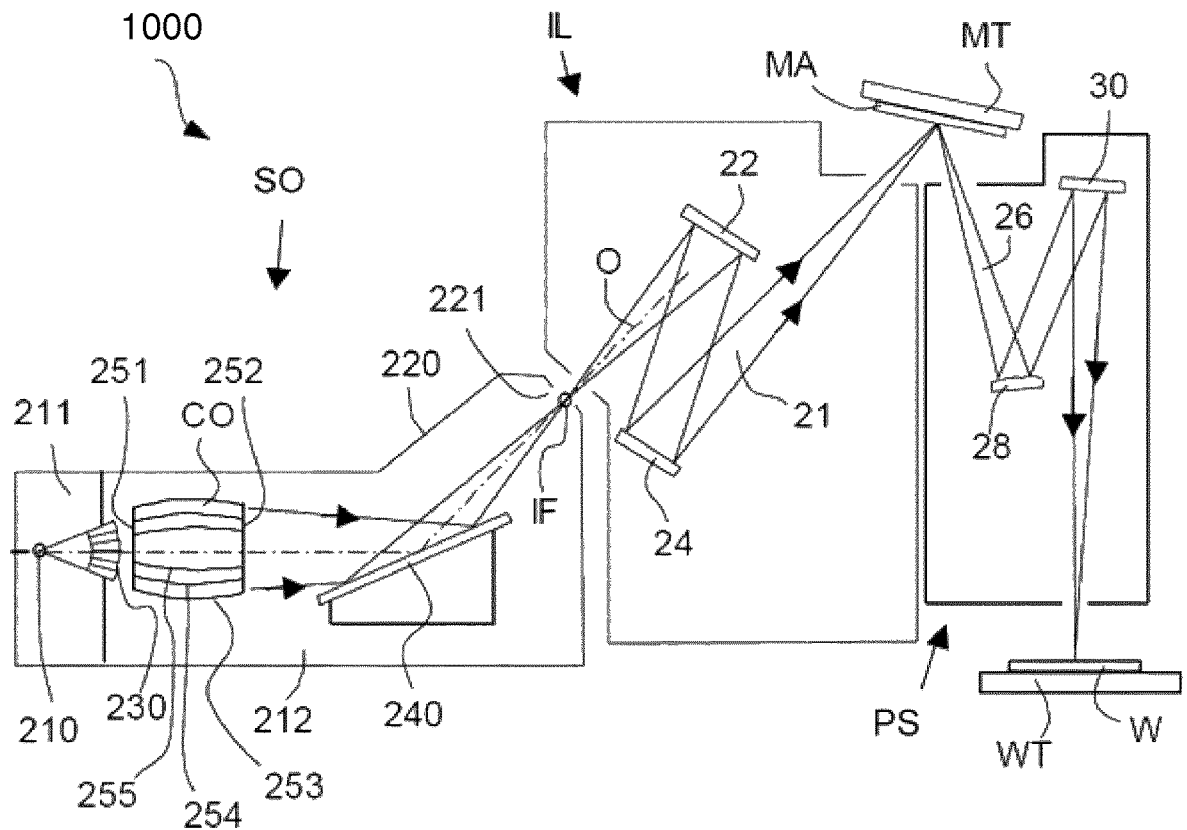
FIG. 14 is a more detailed view of the apparatus in FIG. 13.

FIG. 14 shows the apparatus 1000 in more detail, including the source collector module SO, the illumination system IL, and the projection system PS. The source collector module SO is constructed and arranged such that a vacuum environment can be maintained in an enclosing structure 220 of the source collector module SO. An EUV radiation emitting plasma 210 may be formed by a discharge produced plasma source. EUV radiation may be produced by a gas or vapor, for example Xe gas, Li vapor or Sn vapor in which the very hot plasma 210 is created to emit radiation in the EUV range of the electromagnetic spectrum. The very hot plasma 210 is created by, for example, an electrical discharge causing at least partially ionized plasma. Partial pressures of, for example, 10 Pa of Xe, Li, Sn vapor or any other suitable gas or vapor may be required for efficient generation of the radiation. In an embodiment, a plasma of excited tin (Sn) is provided to produce EUV radiation.

The radiation emitted by the hot plasma 210 is passed from a source chamber 211 into a collector chamber 212 via an optional gas barrier or contaminant trap 230 (in some cases also referred to as contaminant barrier or foil trap) which is positioned in or behind an opening in source chamber 211. The contaminant trap 230 may include a channel structure. Contamination trap 230 may also include a gas barrier or a combination of a gas barrier and a channel structure. The contaminant trap or contaminant barrier 230 further indicated herein at least includes a channel structure, as known in the art.

The collector chamber 211 may include a radiation collector CO which may be a so-called grazing incidence collector. Radiation collector CO has an upstream radiation collector side 251 and a downstream radiation collector side 252. Radiation that traverses collector CO can be reflected off a grating spectral filter 240 to be focused in a virtual source point IF along the optical axis indicated by the dot-dashed line 'O'. The virtual source point IF is commonly referred to as the intermediate focus, and the source collector module is arranged such that the intermediate focus IF is located at or near an opening 221 in the enclosing structure 220. The virtual source point IF is an image of the radiation emitting plasma 210.

Subsequently the radiation traverses the illumination system IL, which may include a faceted field mirror device 22 and a faceted pupil mirror device 24 arranged to provide a desired angular distribution of the radiation beam 21, at the patterning device MA, as well as a desired uniformity of radiation intensity at the patterning device MA. Upon reflection of the beam of radiation 21 at the patterning device MA, held by the support structure MT, a patterned beam 26 is formed and the patterned beam 26 is imaged by the projection system PS via reflective elements 28, 30 onto a substrate W held by the substrate table WT.

More elements than shown may generally be present in illumination optics unit IL and projection system PS. The grating spectral filter 240 may optionally be present, depending upon the type of lithographic projection apparatus. Further, there may be more minors present than those shown in the figures, for example there may be 1-6 additional reflective elements present in the projection system PS than shown in FIG. 14.

Collector optic CO, as illustrated in FIG. 14, is depicted as a nested collector with grazing incidence reflectors 253, 254 and 255, just as an example of a collector (or collector mirror). The grazing incidence reflectors 253, 254 and 255 are disposed axially symmetric around the optical axis O and a collector optic CO of this type may be used in combination with a discharge produced plasma source, often called a DPP source.

Figure 15:
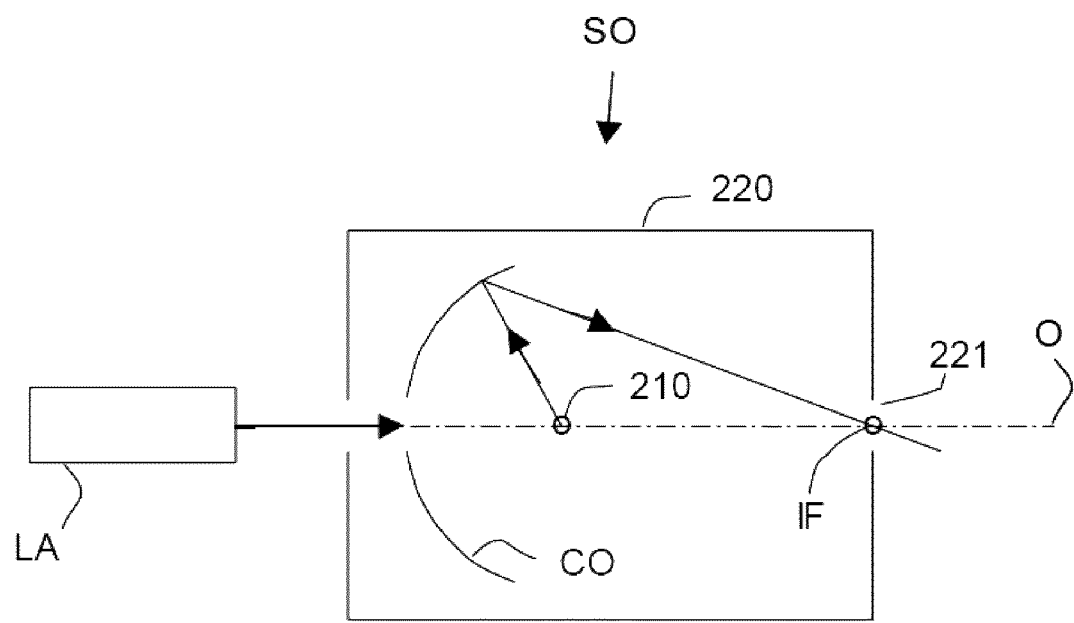
FIG. 15 is a more detailed view of the source collector module of the apparatus of FIG. 13 and FIG. 14.

Alternatively, the source collector module SO may be part of an LPP radiation system as shown in FIG. 15. A laser LA is arranged to deposit laser energy into a fuel, such as xenon (Xe), tin (Sn) or lithium (Li), creating the highly ionized plasma 210 with electron temperatures of several 10's of eV. The energetic radiation generated during de-excitation and recombination of these ions is emitted from the plasma, collected by a near normal incidence collector optic CO and focused onto the opening 221 in the enclosing structure 220.

The concepts disclosed herein may be used with any generic imaging system for imaging sub wavelength features, and may be especially useful with emerging imaging technologies capable of producing increasingly shorter wavelengths. Emerging technologies already in use include EUV (extreme ultra violet), DUV lithography that is capable of producing a 193 nm wavelength with the use of an ArF laser, and even a 157 nm wavelength with the use of a Fluorine laser. Moreover, EUV lithography is capable of producing wavelengths within a range of 20-5 nm by using a synchrotron or by hitting a material (either solid or a plasma) with high energy electrons in order to produce photons within this range.

While the concepts disclosed herein may be used for imaging on a substrate such as a silicon wafer, it shall be understood that the disclosed concepts may be used with any type of lithographic imaging systems, e.g., those used for imaging on substrates other than silicon wafers.

An embodiment of the invention may take the form of a computer program containing one or more sequences of machine-readable instructions describing a method as disclosed herein, or a data storage medium (e.g. semiconductor memory, magnetic or optical disk) having such a computer program stored therein. Further, the machine readable instruction may be embodied in two or more computer programs. The two or more computer programs may be stored on one or more different memories and/or data storage media.

Any controllers described herein may each or in combination be operable when the one or more computer programs are read by one or more computer processors located within at least one component of the lithographic projection apparatus. The controllers may each or in combination have any suitable configuration for receiving, processing, and sending signals. One or more processors are configured to communicate with the at least one of the controllers. For example, each controller may include one or more processors for executing the computer programs that include machine-readable instructions for the methods described above. The controllers may include data storage medium for storing such computer programs, and/or hardware to receive such medium. So the controller(s) may operate according the machine readable instructions of one or more computer programs.

Further embodiments of the invention are disclosed in the list of numbered clauses below:

1. A method of tuning a patterning stack, the method comprising:
   defining a function that measures how a parameter representing a physical characteristic pertaining to a pattern transferred into a patterning stack on a substrate is affected by change in a patterning stack variable, the patterning stack variable representing a physical characteristic of a material layer of the patterning stack;
   varying, by a hardware computer system, the patterning stack variable and evaluating, by the hardware computer system, the function with respect to the varied patterning stack variable, until a termination condition is satisfied; and
   outputting a value of the patterning stack variable when the termination condition is satisfied.
2. The method of clause 1, wherein the patterning stack variable is one or more selected from: a refractive index of a layer of the patterning stack, an extinction coefficient of a layer of the patterning stack, and/or a thickness of a layer of the patterning stack.
3. The method of clause 1 or clause 2, wherein the parameter represents one or more selected from: a physical characteristic of a metrology process, a physical characteristic of a lithographic process, and/or a physical characteristic of an etch process.
4. The method of clause 1 or clause 2, wherein the parameter is one or more selected from: an alignment parameter, a leveling parameter, a metrology parameter, a standing wave parameter, a contrast variation parameter, a sidewall angle parameter, a front end critical dimension parameter, a footing parameter, a resist loss parameter, an asymmetry parameter, a back end critical dimension parameter, a pattern placement parameter, a top rounding parameter and/or a litho-etch bias parameter.
5. The method of any of clauses 1-4, wherein the function measures how a plurality of parameters each representing a physical characteristic pertaining to the pattern transferred into the patterning stack on the substrate is affected by change in the patterning stack variable.
6. The method of clause 5, wherein the plurality of parameters comprises a physical characteristic of a metrology process.
7. The method of any of clauses 1-6, wherein the evaluating the function with respect to the varied patterning stack variable comprises performing a computer simulation to determine a value of the parameter based on the varied patterning stack variable.
8. The method of clause 7, wherein the parameter comprises a physical characteristic of an etch process and the computer simulation employs an etch model.
9. The method of clause 7 or clause 8, wherein the parameter comprises a physical characteristic of a metrology process and the computer simulation employs a metrology model.
10. The method of any of clauses 7-9, wherein the parameter comprises a physical characteristic of a lithographic process and the computer simulation employs a resist model.
11. The method of any of clauses 1-10, wherein the evaluating the function with respect to the varied patterning stack variable comprises determining a value for the parameter based on a pattern profile obtained by measurement or simulation.
12. The method of clause 11, wherein the pattern profile is either a resist image or an etch image.
13. The method of any of clauses 1-12, wherein the evaluating the function with respect to the varied patterning stack variable comprises determining a value for a parameter representing of a physical characteristic a measurement process by measurement or simulation.
14. The method of any of clauses 1-13, wherein the function is a cost function and evaluating the function comprising obtaining a value of the patterning stack variable such the cost function has a value of the parameter at a local extrema or within a preset range around the local extrema value.
15. A method comprising:
   optimizing, by a hardware computer system, a patterning stack variable, the patterning stack variable representing a physical characteristic of a material layer of a patterning stack on a substrate, with respect to a plurality of parameters each representing a physical characteristic pertaining to a pattern transferred into the patterning stack on the substrate, until a termination condition is satisfied; and
   outputting a value of the patterning stack variable when the termination condition is satisfied.
16. The method of clause 15, wherein the patterning stack variable is one or more selected from: a refractive index of a layer of the patterning stack, an extinction coefficient of a layer of the patterning stack, and/or a thickness of a layer of the patterning stack.
17. The method of clause 15 or clause 16, wherein at least one of the parameters represents one or more selected from: a physical characteristic of a metrology process, a physical characteristic of a lithographic process, and/or a physical characteristic of an etch process.
18. The method of clause 15 or clause 17, wherein the parameters comprise one or more selected from: an alignment parameter, a leveling parameter, a metrology parameter, a standing wave parameter, a contrast variation parameter, a sidewall angle parameter, a front end critical dimension parameter, a footing parameter, a resist loss parameter, an asymmetry parameter, a back end critical dimension parameter, a pattern placement parameter, a top rounding parameter and/or a litho-etch bias parameter.

19. The method of any of clauses 15-18, wherein the parameters comprise at least parameter representing a physical characteristic of a metrology process.

20. The method of any of clauses 15-19, wherein the optimizing comprises performing a computer simulation to determine values of the parameters based on the patterning stack variable.

21. The method of clause 20, wherein at least one of the parameters represents a physical characteristic of an etch process and the computer simulation employs an etch model.

22. The method of clause 20 or clause 21, wherein at least one of the parameters represents a physical characteristic of a metrology process and the computer simulation employs a metrology model.

23. The method of any of clauses 20-22, wherein at least one of the parameters represents a physical characteristic of a lithographic process and the computer simulation employs a resist model.

24. The method of any of clauses 15-23, wherein the optimizing comprises determining a value for at least one of the parameters based on a pattern profile obtained by measurement or simulation.

25. The method of clause 24, wherein the pattern profile is either a resist image or an etch image.

26. The method of any of clauses 15-25, wherein the optimizing comprises determining a value for at least one of the parameters representing a physical characteristic of a measurement process by measurement or simulation.

27. The method of any of clauses 15-26, wherein the optimizing involves evaluating a cost function to obtain a value of the patterning stack variable such the cost function has a value of the parameters at a local extrema or within a preset range around the local extrema value.

28. The method of any of clauses 15-27, further comprising optimizing the plurality of parameters for a plurality of patterning stack variables.

29. The method of clause 28, wherein the plurality of patterning stack variables comprises patterning stack variables each for different layers of the patterning stack.

30. A non-transitory computer program product comprising machine-readable instructions configured to cause a processor to perform any of the method of clauses 1-29.

The term "optimizing" and "optimization" as used herein refers to or means adjusting an apparatus and/or process, e.g., a lithographic apparatus or an optical lithography process step, such that patterning and/or device fabrication results and/or processes (e.g., of lithography) have one or more desirable characteristics, such as higher accuracy of projection of a design layout on a substrate, larger process window, etc. Thus, an optimizing or optimization process as used herein refers to or means a process that identifies one or more values for one or more parameters that provide an improvement, e.g. a local optimum, in at least one relevant metric, compared to an initial set of one or more values for those one or more parameters. "Optimum" and other related terms should be construed accordingly. In an embodiment, optimization steps can be applied iteratively to provide further improvements in one or more metrics.

Although specific reference may have been made above to the use of embodiments in the context of optical lithography, it will be appreciated that an embodiment of the invention may be used in other applications, for example imprint lithography, and where the context allows, is not limited to optical lithography. In imprint lithography, a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

Although specific reference may be made in this text to the manufacture of ICs, it should be understood that the description herein may have other applications. For example, it may be employed in the manufacture of integrated optical systems, guidance and detection patterns for magnetic domain memories, flat-panel displays, liquid-crystal displays (LCDs), thin film magnetic heads, etc. The skilled artisan will appreciate that, in the context of such alternative applications, any use of the terms "wafer" or "die" herein may be considered as synonymous with the more general terms "substrate" or "target portion", respectively.

The substrate referred to herein may be processed, before or after exposure, in for example a track (a tool that typically applies a layer of resist to a substrate and develops the exposed resist), an inspection/metrology tool and/or an etch tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including near infrared radiation (e.g., radiation having a wavelength in the range of about 700 nm to about 1400 nm), visible radiation (e.g., radiation having a wavelength in the range of about 390 nm to 700 nm, e.g., about 633 nm or in the range of about 495 nm to about 570 nm, e.g., about 515 nm, about 520 nm, or about 532 nm), ultraviolet (UV) radiation (e.g. having a wavelength of or about 365, 355, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and/or electrostatic optical components.

The descriptions above are intended to be illustrative, not limiting. Thus, it will be apparent to one skilled in the art that modifications may be made to the invention as described without departing from the scope of the claims set out below. For example, one or more aspects of one or more embodiments may be combined with or substituted for one or more aspects of one or more other embodiments as appropriate. Therefore, such adaptations and modifications are intended to be within the meaning and range of equivalents of the disclosed embodiments, based on the teaching and guidance presented herein. It is to be understood that the phraseology or terminology herein is for the purpose of description by example, and not of limitation, such that the terminology or phraseology of the present specification is to be interpreted by the skilled artisan in light of the teachings and guidance. The breadth and scope of the invention should not be limited by any of the above-described exemplary embodiments, but should be defined only in accordance with the following claims and their equivalents.

What is claimed is:

1. A method of tuning a patterning stack, the method comprising:
    defining a function that measures how a parameter representing a physical structural characteristic pertaining to a pattern as structurally transferred into a patterning stack on a substrate is affected by change in a patterning stack variable, the patterning stack variable representing a physical characteristic of a material layer of the patterning stack;
    varying, by a hardware computer system, the patterning stack variable and evaluating, by the hardware computer system, the function with respect to the varied patterning stack variable, until a termination condition is satisfied; and
    outputting a value of the patterning stack variable when the termination condition is satisfied.

2. The method of claim 1, wherein the patterning stack variable is one or more selected from: a refractive index of a layer of the patterning stack, an extinction coefficient of a layer of the patterning stack, and/or a thickness of a layer of the patterning stack.

3. The method of claim 1, wherein the parameter represents one or more selected from: a physical characteristic of a metrology process, a physical characteristic of a lithographic process, and/or a physical characteristic of an etch process.

4. The method of claim 1, wherein the parameter is one or more selected from: a metrology parameter, a standing wave parameter, a contrast variation parameter, a sidewall angle parameter, a front end critical dimension parameter, a footing parameter, a resist loss parameter, an asymmetry parameter, a back end critical dimension parameter, a pattern placement parameter, a top rounding parameter and/or a litho-etch bias parameter.

5. The method of claim 1, wherein the function measures how a plurality of parameters each representing a physical characteristic pertaining to the pattern to be transferred into the patterning stack on the substrate is affected by change in the patterning stack variable.

6. The method of claim 5, wherein the plurality of parameters comprises a physical characteristic of a metrology process.

7. The method of claim 1, wherein the evaluating the function with respect to the varied patterning stack variable comprises performing a computer simulation to determine a value of the parameter based on the varied patterning stack variable.

8. The method of claim 7, wherein the parameter comprises a physical characteristic of an etch process and the computer simulation employs an etch model.

9. The method of claim 7, wherein the parameter comprises a physical characteristic of a metrology process and the computer simulation employs a metrology model.

10. The method of claim 7, wherein the parameter comprises a physical characteristic of a lithographic process and the computer simulation employs a resist model.

11. The method of claim 1, wherein the evaluating the function with respect to the varied patterning stack variable comprises determining a value for the parameter based on a pattern profile obtained by measurement or simulation.

12. The method of claim 11, wherein the pattern profile is either a resist image or an etch image.

13. The method of claim 1, wherein the evaluating the function with respect to the varied patterning stack variable comprises determining a value for a parameter representing a physical characteristic of a measurement process obtained by measurement or simulation.

14. The method of claim 1, wherein the function is a cost function and evaluating the function comprising obtaining a value of the patterning stack variable such that the cost function has a value of the parameter at a local extrema or within a preset range around the local extrema value.

15. The method of claim 1, wherein the parameter is an alignment parameter or a leveling parameter.

16. A non-transitory computer program product comprising machine-readable instructions, that when executed by a processor system, are configured to cause the processor system to at least:
    define a function that measures how a parameter representing a physical structural characteristic pertaining to a pattern as structurally transferred into a patterning stack on a substrate is affected by change in a patterning stack variable, the patterning stack variable representing a physical characteristic of a material layer of the patterning stack;
    vary the patterning stack variable and evaluate the function with respect to the varied patterning stack variable, until a termination condition is satisfied; and
    output a value of the patterning stack variable when the termination condition is satisfied.

17. The computer program product of claim 16, wherein the patterning stack variable is one or more selected from: a refractive index of a layer of the patterning stack, an extinction coefficient of a layer of the patterning stack, and/or a thickness of a layer of the patterning stack.

18. The computer program product of claim 16, wherein the parameter represents one or more selected from: a physical characteristic of a metrology process, a physical characteristic of a lithographic process, and/or a physical characteristic of an etch process.

19. The computer program product of claim 16, wherein the function measures how a plurality of parameters each representing a physical characteristic pertaining to the pattern to be transferred into the patterning stack on the substrate is affected by change in the patterning stack variable.

20. A method comprising:
    optimizing, by a hardware computer system, a patterning stack variable, the patterning stack variable representing a physical characteristic of a material layer of a patterning stack on a substrate, with respect to a plurality of parameters each representing a physical structural characteristic pertaining to a pattern as structurally transferred into the patterning stack on the substrate, until a termination condition is satisfied; and
    outputting a value of the patterning stack variable when the termination condition is satisfied.

21. A non-transitory computer program product comprising machine-readable instructions, that when executed by a processor system, are configured to cause the processor system to at least:
    optimize a patterning stack variable, the patterning stack variable representing a physical structural characteristic of a material layer of a patterning stack on a substrate, with respect to a plurality of parameters each representing a physical characteristic pertaining to a pattern as structurally transferred into the patterning stack on the substrate, until a termination condition is satisfied; and output a value of the patterning stack variable when the termination condition is satisfied.

\* \* \* \* \*